(12) United States Patent
Hatzilias et al.

(10) Patent No.: US 11,391,967 B1
(45) Date of Patent: Jul. 19, 2022

(54) TRANSPARENT CIRCUIT BOARDS WITH MULTILAYERED TRACES

(71) Applicant: Facebook Technologies, LLC, Menlo Park, CA (US)

(72) Inventors: Karol Constantine Hatzilias, Kenmore, WA (US); Jeb Wu, Redmond, WA (US); Paul Armen Tchertchian, Fremont, CA (US); Robin Sharma, Redmond, WA (US); Christopher Yuan Ting Liao, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 280 days.

(21) Appl. No.: 16/406,369

(22) Filed: May 8, 2019

(51) Int. Cl.
| | |
|---|---|
| *G02C 7/00* | (2006.01) |
| *G02C 3/00* | (2006.01) |
| *A61B 3/00* | (2006.01) |
| *G02F 1/1335* | (2006.01) |
| *H04N 7/00* | (2011.01) |
| *G09G 5/00* | (2006.01) |
| *G03H 1/00* | (2006.01) |
| *G02B 27/14* | (2006.01) |
| *G02C 7/08* | (2006.01) |
| *H05K 1/02* | (2006.01) |
| *G02B 27/01* | (2006.01) |

(52) U.S. Cl.
CPC ......... *G02C 7/083* (2013.01); *G02B 27/0172* (2013.01); *H05K 1/0274* (2013.01); *G02B 2027/0178* (2013.01); *H05K 2201/0108* (2013.01); *H05K 2201/10121* (2013.01)

(58) Field of Classification Search
CPC ... G02C 7/02; G02C 5/00; G02C 7/04; G02C 7/08; G09G 3/003; B29D 11/00826; A61B 3/103; G02B 27/0172; G02B 27/01; G02B 27/017; G02B 27/145; G02B 27/0149; G02B 27/0103
USPC ........ 351/159.01, 41, 159.02, 159.39, 159.4, 351/159.74–159.77, 178, 200, 205; 349/11; 348/115; 345/7–9; 359/618, 359/13–14, 630–633
See application file for complete search history.

(56) References Cited

U.S. PATENT DOCUMENTS

| | | | |
|---|---|---|---|
| 2012/0050681 A1* | 3/2012 | Bonnin | A61B 3/113 351/210 |
| 2012/0081892 A1* | 4/2012 | Kubota | G02B 27/017 362/231 |
| 2014/0319496 A1* | 10/2014 | Kim | H01L 51/0097 257/40 |
| 2020/0150426 A1* | 5/2020 | Hatzilias | G02B 27/0172 |

\* cited by examiner

*Primary Examiner* — Dawayne Pinkney
(74) *Attorney, Agent, or Firm* — FisherBroyles, LLP

(57) ABSTRACT

The disclosed transparent circuit board may include a transparent substrate, a first conductive trace coupled to the transparent substrate, and an electrical component having a bottom surface facing the transparent substrate and a top surface facing away from the transparent substrate. The bottom surface may include a first electrical contact coupled to the first conductive trace, and the top surface may include a second electrical contact. The transparent circuit board may also include a second conductive trace electrically connected to the second electrical contact and a transparent encapsulation layer coupled to the transparent substrate and encapsulating the electrical component. Various other ophthalmic devices, systems, and methods are also disclosed.

20 Claims, 29 Drawing Sheets

TRANSPARENT CIRCUIT BOARDS WITH MULTILAYERED TRACES

BACKGROUND

Artificial reality systems include systems for virtual reality, augmented reality, mixed reality, or hybrid reality. Conventional artificial reality systems present images to a user to overlay or replace the user's view of a real-world environment. To this end, some artificial reality systems include a display that is mounted on a user's head and in front of the user's eyes. In such head mounted displays (HMDs), a position of the user's eyes may be tracked to improve the focus of the displayed image, to determine or predict where or at what object (virtual or real) the user is looking, or for other purposes.

Eye tracking may be accomplished by directing an array of light sources (e.g., an array of infrared (IR) sources) at a user's eye and using a camera to detect patterns of the light reflecting from the eye (e.g., glints). In conventional artificial-reality glasses, the light sources and cameras are typically mounted around the periphery of the frame of the glasses. Unfortunately, eyelids and eyelashes may block the light from the light sources or the reflections of the light from the eye to the cameras. In addition, light may not reach the eye or the cameras when the user looks in different directions and/or the position of the eye or eyelid shifts.

Accordingly, the present disclosure recognizes a need and solution for improving eye-tracking systems.

SUMMARY

As will be described in greater detail below, the instant disclosure describes ophthalmic lenses and other transparent circuit boards with stacked leads that may be used for, among other things, powering in-field eye-tracking illumination components. In some examples, a transparent circuit board may include a transparent substrate, a first conductive trace coupled to the transparent substrate, and an electrical component having a bottom surface facing the transparent substrate and a top surface facing away from the transparent substrate. The bottom surface may include a first electrical contact coupled to the first conductive trace, and the top surface may include a second electrical contact. The transparent circuit board may also include a second conductive trace electrically connected to the second electrical contact and a transparent encapsulation layer coupled to the transparent substrate and encapsulating the electrical component.

In some examples, the first conductive trace may be coupled to a top surface of the transparent substrate, a bottom surface of the transparent encapsulation layer may be coupled to the top surface of the transparent substrate, the second conductive trace may be coupled to a top surface of the transparent encapsulation layer and may run parallel to the first conductive trace, and the transparent circuit board may further include an additional transparent encapsulation layer coupled to the top surface of the transparent encapsulation layer and encapsulating the second conductive trace. In some examples, the first conductive trace and the second conductive trace may be positioned to overlap relative to a field-of-view of a user when the user is looking through the transparent circuit board. In at least one example, the transparent substrate may be an ophthalmic lens, and/or the electrical component may be a light emitting component of an eye-tracking system. In some examples, the light emitting component may be a vertical-cavity surface-emitting laser. The transparent circuit board may also include additional electrical components coupled to the transparent substrate and encapsulated by the transparent encapsulation layer.

In some examples, the electrical component may further include a side having a passivation material, the first conductive trace may be coupled to a top surface of the transparent substrate, the second conductive trace may be coupled to the top surface of the transparent substrate, the transparent circuit board may further include a conductive material coupled to the side of the electrical component and electrically coupling the second electrical contact to the second conductive trace, and a bottom surface of the transparent encapsulation layer may be coupled to the top surface of the transparent substrate. In other examples, the first conductive trace may be coupled to a top surface of the transparent substrate, the electrical component may include a channel passing through the electrical component from the top surface to the bottom surface and an internal passivation layer lining the channel, and the second conductive trace may be coupled to the top surface of the transparent substrate and electrically connected to the second electrical contact through the channel. In some examples, the first conductive trace and the second conductive trace may be operable to provide power to the electrical component.

A corresponding ophthalmic device may include a see-through element positioned to be in a field-of-view of a user of the ophthalmic device, a first conductive trace coupled to the see-through element, and an electrical component having a bottom surface facing the see-through element and a top surface facing away from the see-through element. The bottom surface may include a first electrical contact coupled to the first conductive trace, and the top surface may include a second electrical contact. The ophthalmic device may also include a second conductive trace electrically connected to the second electrical contact and a transparent encapsulation layer coupled to the see-through element and encapsulating the electrical component.

In some examples, the electrical component may be one light source in an array of light sources operable to direct, as part of an eye-tracking system, light at an eye of the user, and the eye-tracking system may use specular or diffuse reflections of the light from the eye for pupil tracking. In at least one example, the array of light sources may include an array of vertical-cavity surface-emitting lasers. In some examples, the see-through element may be a see-through near-field display of an artificial-reality system. Additionally or alternatively, the see-through element may be a corrective ophthalmic lens.

In some examples, the first conductive trace may be coupled to a top surface of the see-through element, a bottom surface of the transparent encapsulation layer may be coupled to the top surface of the see-through element, the second conductive trace may be coupled to a top surface of the transparent encapsulation layer and may run parallel to the first conductive trace, the ophthalmic device may further include an additional transparent encapsulation layer coupled to the top surface of the transparent encapsulation layer and encapsulating the second conductive trace, and the first conductive trace and the second conductive trace may be positioned to overlap relative to the field-of-view of the user when the user is looking through the see-through element. In other examples, the electrical component may further include a side made of a passivation material, the first conductive trace may be coupled to a top surface of the see-through element, the second conductive trace may be coupled to the top surface of the see-through element, the ophthalmic device may further include a conductive material coupled to the side of the electrical component and electrically coupling the second electrical contact to the second conductive trace, and a bottom surface of the transparent encapsulation layer may be coupled to the top surface of the see-through element.

In some examples, the first conductive trace may be coupled to a top surface of the see-through element, the electrical component may further include a channel passing through the electrical component from the top surface of the electrical component to the bottom surface of the electrical component, and the second conductive trace may be coupled to the top surface of the see-through element and electrically connected to the second electrical contact through the channel. In at least one example, the ophthalmic device may include a support housing supporting the see-through element and an additional electrical component within the support housing. In such examples, the first conductive trace and the second conductive trace may extend from the electrical component to the additional electrical component. In some examples, the additional electrical component may be a power source, and the first conductive trace and the second conductive trace may be operable to provide power to the electrical component.

A corresponding method may include (1) applying a first conductive trace to a top surface of a transparent substrate, (2) bonding, to the first conductive trace, an electrical component having a bottom surface facing the transparent substrate that includes a first electrical contact that is bonded to the first conductive trace and a top surface facing away from the transparent substrate that includes the second electrical contact, (3) applying a first transparent encapsulation layer to the top surface of the transparent substrate, (4) applying a second conductive trace to the second electrical contact and a top surface of the first transparent encapsulation layer, and (5) applying a second transparent encapsulation layer to a top surface of the first transparent encapsulation layer.

Features from any of the embodiments described herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
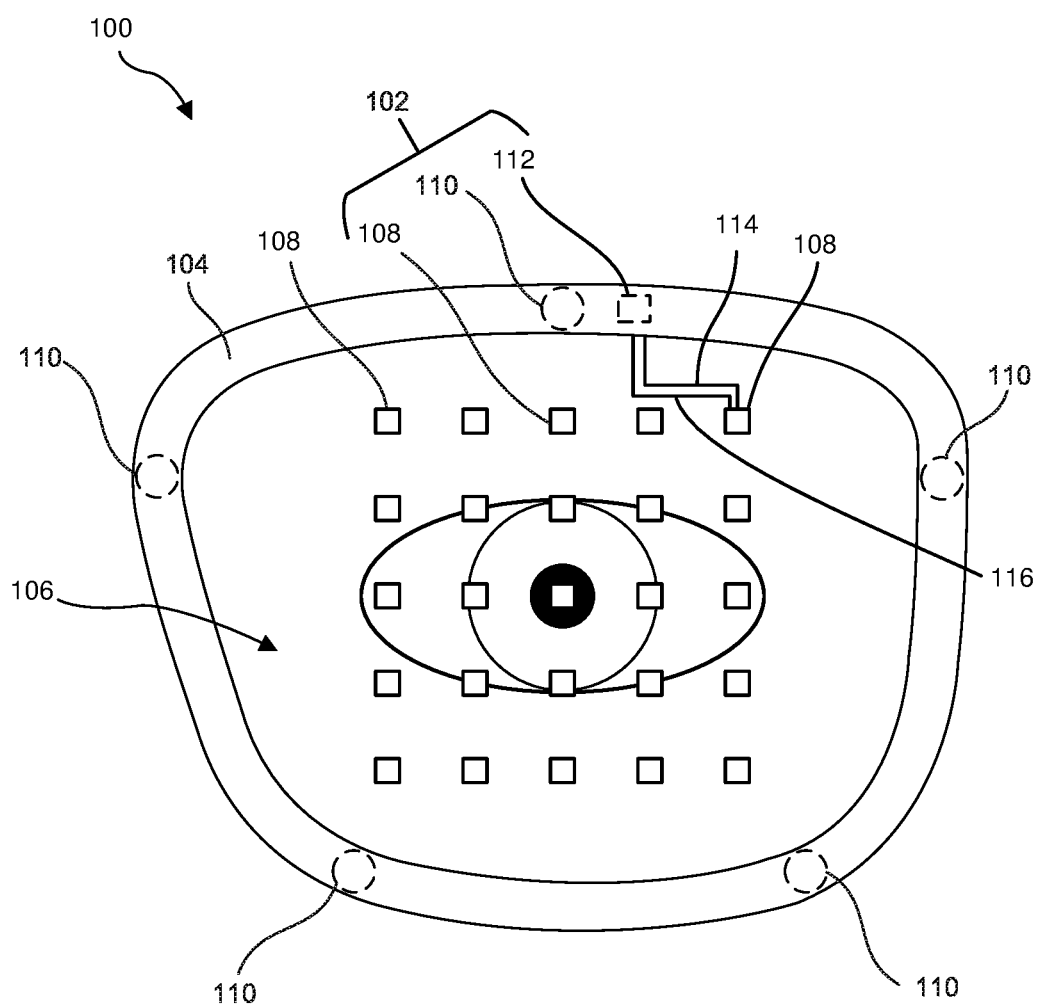
FIG. 1 shows a front view of an exemplary ophthalmic device including an eye-tracking system, according to at least one embodiment of the present disclosure.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is directed generally to transparent circuit boards with stacked leads and more specifically to ophthalmic lenses and/or see-through near-eye displays having integrated circuits with stacked traces or leads. The present disclosure includes several designs and configurations for electrically connecting components (e.g., vertical-cavity surface-emitting lasers (VCSELs)) on a transparent circuit board (e.g., a near-eye optical element made of glass, plastic, or sapphire) for use in-field illumination/eye tracking or other transparent circuit board applications.

A VCSEL may have two contact terminals (e.g., an anode and a cathode), one on the emitting side of the VCSEL and one on the opposite side of the VCSEL. In one embodiment, components like these may be electrically connected on a transparent circuit board via (1) a first conductive trace applied to the transparent circuit board that contacts one side of the component and (2) a second conductive trace separated by a transparent encapsulation layer surrounding the component and contacting the other side of the component. In other embodiments, VCSEL-like components may be electrically connected on a transparent circuit board via two conductive traces that are both applied to the transparent circuit board. In one embodiment, a passivation layer on the outside of the component may enable a connection to be made (e.g., via a conductive paste) from the topside of the component to one of the conductive traces. In another embodiment, a passivation layer on an inside pathway of the component may enable a connection to be made (e.g., via a conductive paste) from the topside of the component to one of the conductive traces.

Embodiments of the present disclosure may have one or more advantages over conventional systems. For example, by using stacked or non-stacked traces or leads to electrically connect in-field electrical components to power, control, or other processing components, the embodiments described herein may enable the integration of in-field electrical components (e.g., light sources) within ophthalmic lenses, see-through near-eye displays, and/or other types of transparent circuit boards. In some embodiments, stacked traces within a transparent circuit board or ophthalmic lens may run in parallel and/or may overlap each other such that overall trace area visible to users is reduced and/or minimized. Moreover, the embodiments described herein may reduce or eliminate the need for or use of wire-bonding connections in these systems, which may reduce the thicknesses of in-field circuitry and transparent circuit boards, which may reduce the weight and thickness of these systems as compared to conventional wire bond designs.

Figure 26:
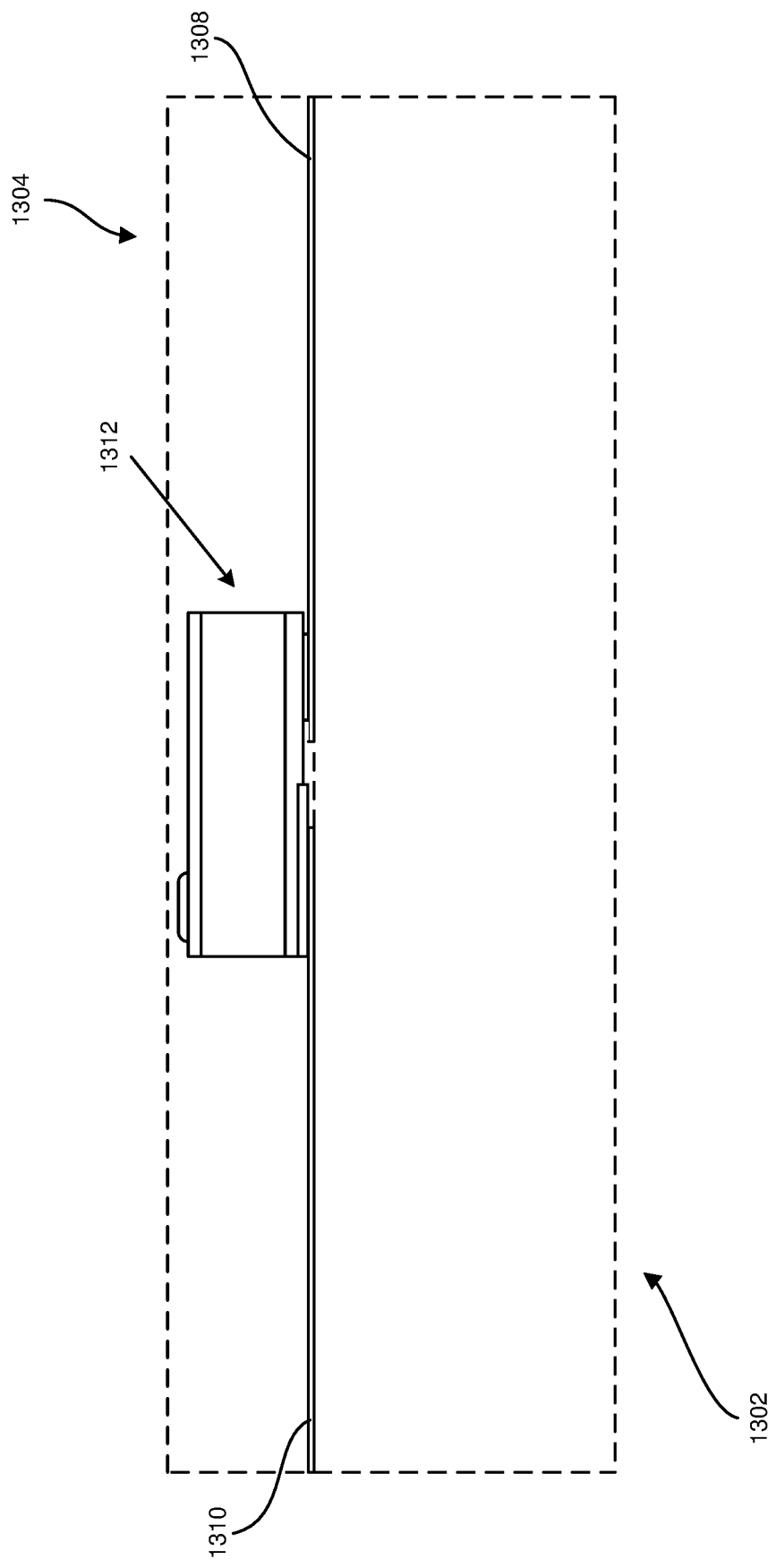
FIG. 26 shows a front view of another exemplary fabrication step of the exemplary transparent circuit board of FIG. 13, according to at least one embodiment of the present disclosure.
Figure 27:
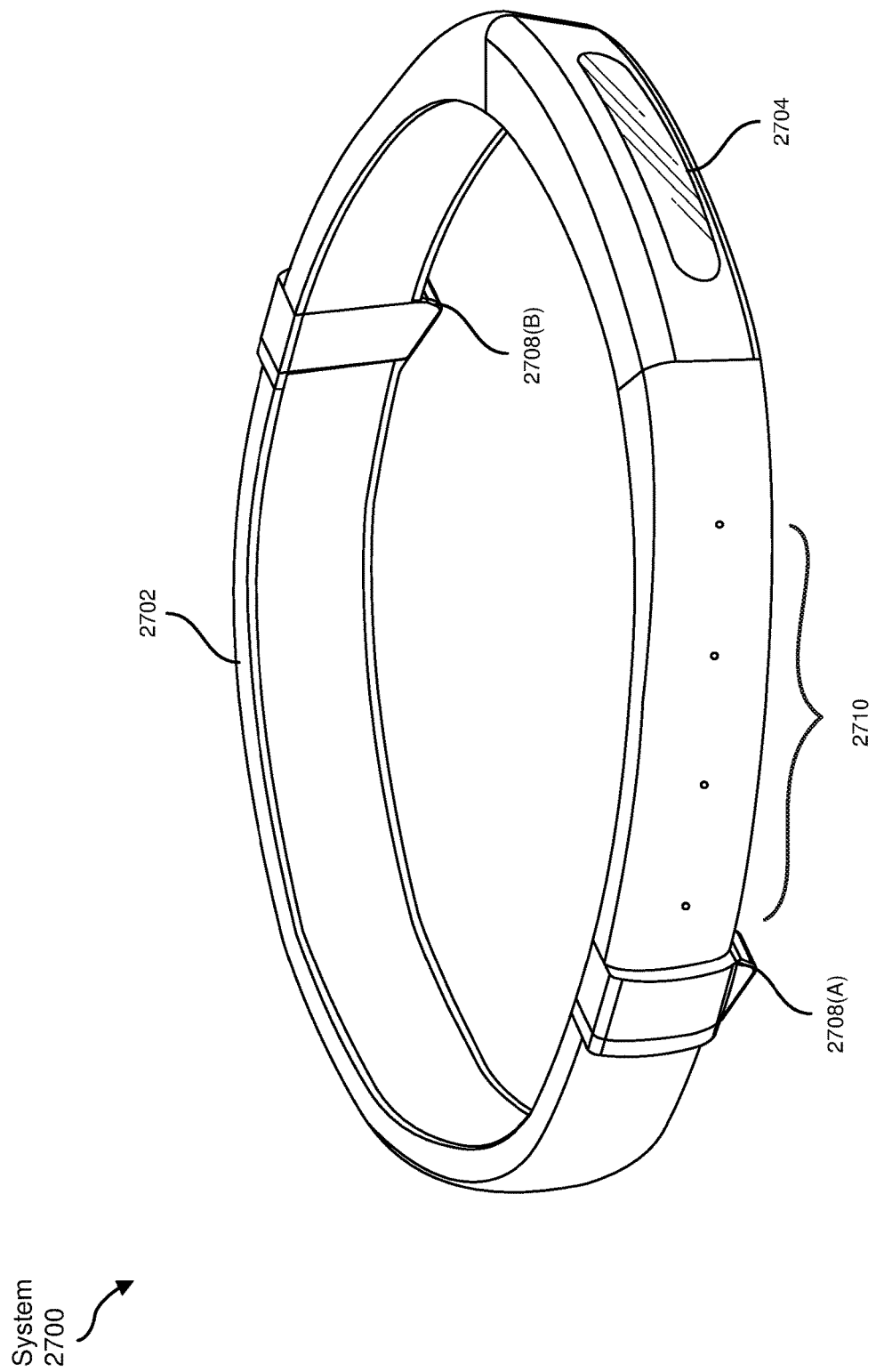
FIG. 27 is an illustration of an exemplary artificial-reality headband that may be used in connection with embodiments of this disclosure.
Figure 28:
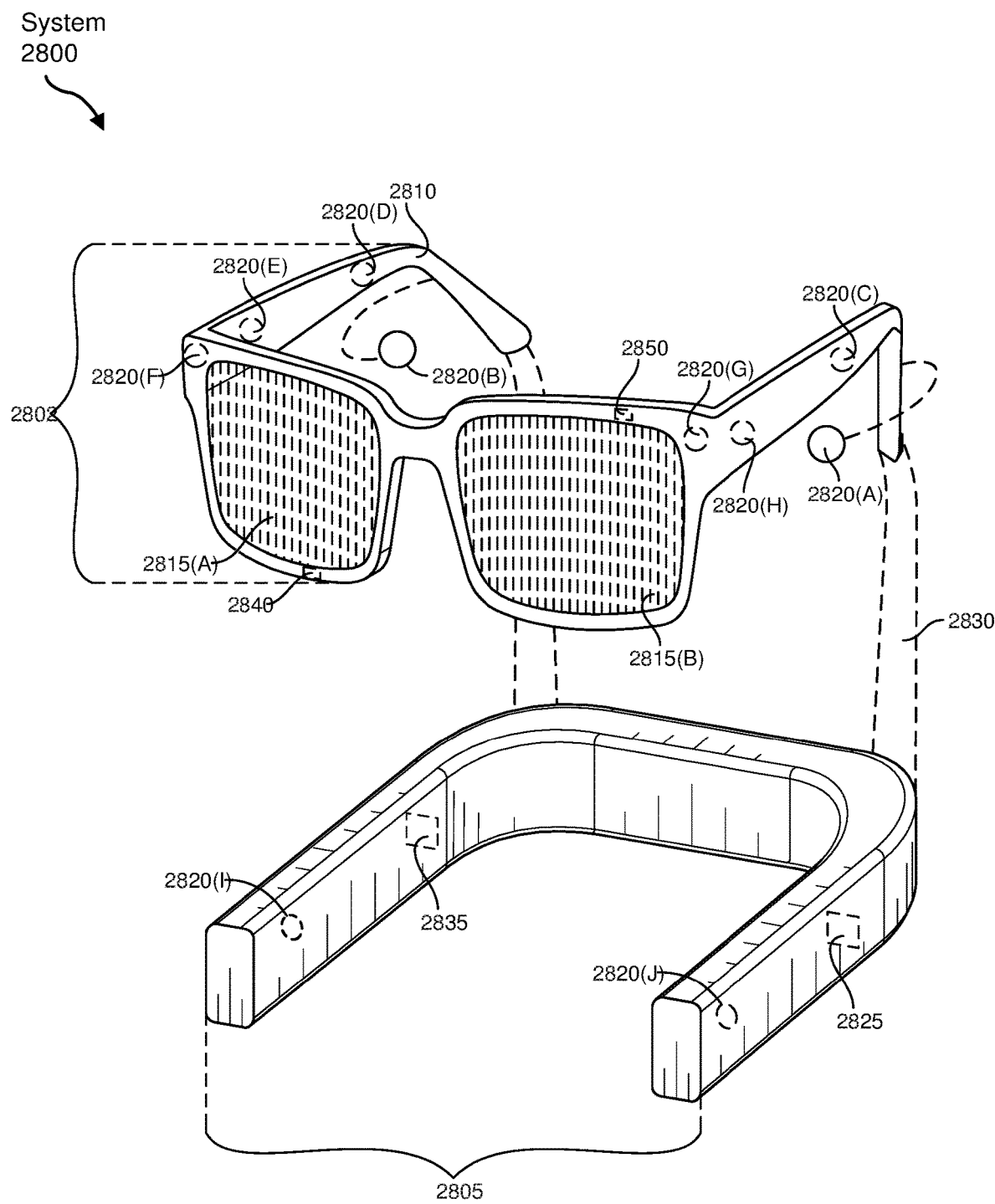
FIG. 28 is an illustration of exemplary augmented-reality glasses that may be used in connection with embodiments of this disclosure.
Figure 29:
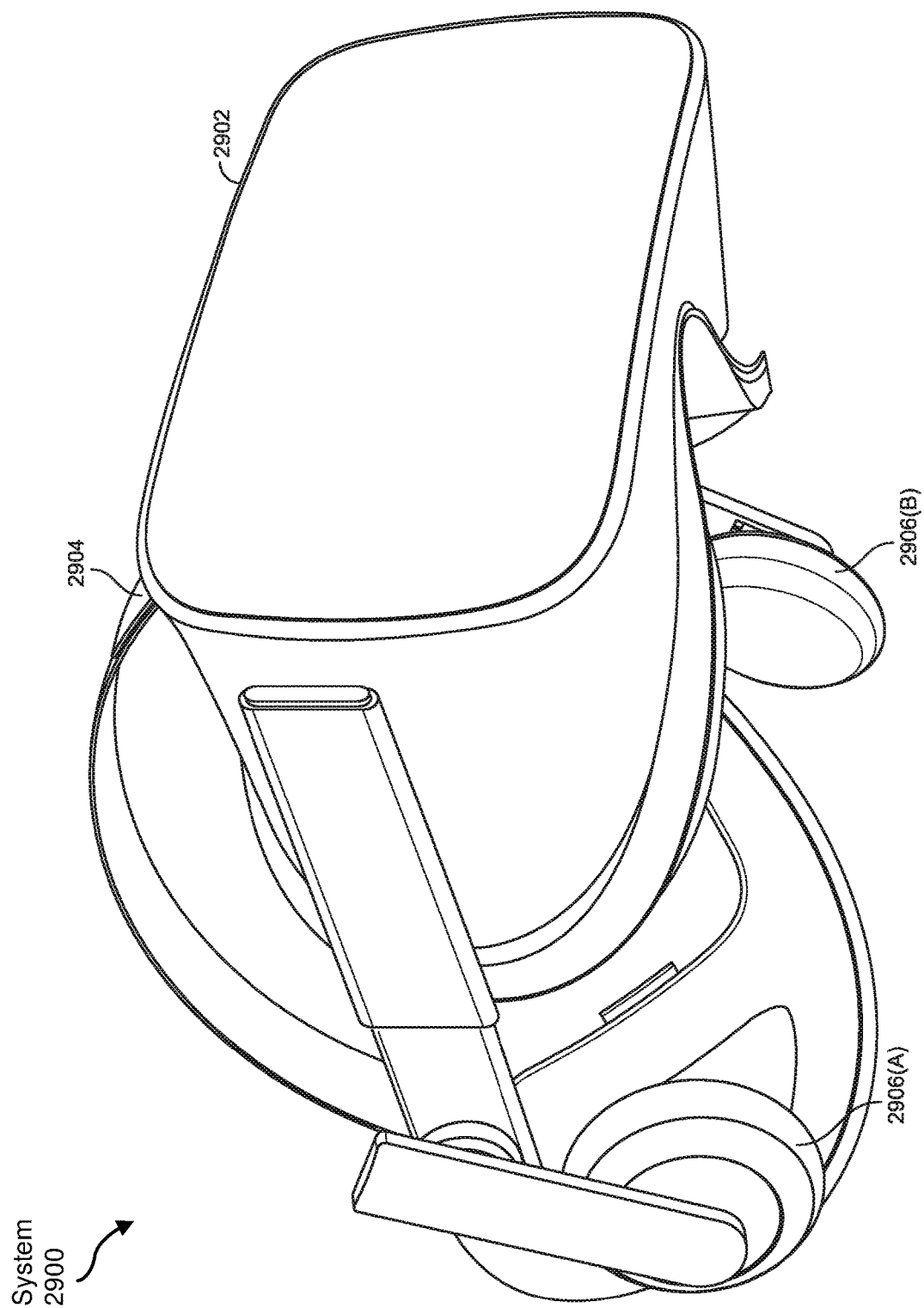
FIG. 29 is an illustration of an exemplary virtual-reality headset that may be used in connection with embodiments of this disclosure.

The following will provide with reference to FIG. 1, detailed descriptions of an example ophthalmic device. With reference to FIGS. 2, 12, 13, and 14, detailed descriptions are provided of example transparent circuit boards and ophthalmic devices with stacked leads. With reference to FIGS. 3-11 and 15-26, detailed descriptions are provided of example methods for fabricating the example transparent circuit boards and ophthalmic devices shown in FIGS. 2, 12, and 13. With reference to FIGS. 27-29, detailed descriptions of various artificial reality systems are provided.

In some embodiments, ophthalmic devices (e.g., head-mounted displays) of the present disclosure may include eye-tracking systems for detecting the position and/or orientation of a user's eye. The eye-tracking systems may be used to detect or estimate the direction of a user's gaze, such as to predict where the user is looking in a real-world environment (e.g., through a transparent or partially transparent display element) or in a virtual environment (e.g., in an image displayed to the user by an artificial-reality system).

For example, FIG. 1 illustrates a front view of a single-eye display system 100 that includes an eye-tracking system 102. Display system 100 may, in some embodiments, be or include a head-mounted display (HMD) that is configured to be positioned directly in front of a user's eye. Display system 100 may include a frame 104 and an ophthalmic element 106 (e.g., a lens or see-through display) supported by frame 104. Eye-tracking system 102 may include an in-field illumination system having one or more light sources 108 for directing light (e.g., infrared light) to the user's eye and one or more light sensors 110 (e.g., IR cameras) for detecting light originating from light source(s) 108 and reflecting from the user's eye.

Although FIG. 1 illustrates a single-eye display system 100 in a head-mounted eyeglass form factor, the present disclosure is not so limited. For example, ophthalmic systems according to the present disclosure may include two HMD systems (one per eye) or a single HMD system configured for use with two eyes (e.g., a virtual-reality display system). In addition, embodiments of the present disclosure may be implemented in a desktop computer screen, a television screen, a laptop computer screen, a mobile device (e.g., cellular phone, tablet computer, gaming device, etc.) screen, a digital watch screen, corrective eye glasses, corrective contact lenses, other types of lenses, windows, mirrors, head-up displays, or any other suitable see-through component or transparent or partially transparent device.

In some examples, ophthalmic element 106 may include a display system having an array of visible light pixels for displaying a visible image (e.g., a digital image, a digital video) to the user. The ophthalmic element 106 may display the visible light pixels in a variety of ways. For example, ophthalmic element 106 may include a waveguide for directing visible light images originating from a projector supported by frame 104, a light-emitting diode (LED) panel, an organic LED (OLED) panel, a laser display panel, a liquid crystal display (LCD) panel, etc.

Light source(s) 108 may include any type of light-emitting electrical component. Light source(s) 108 may be, for example, a vertical-cavity surface-emitting laser (VCSEL), an OLED, an infrared light-emitting diode (IR LED), or a quantum dot. Light source(s) 108 may be electrically coupled to other electrical components within frame 104 or ophthalmic element 106 via conductive traces within ophthalmic element 106. As shown, light source(s) 108 may be electrically coupled to electrical component 112 via conductive traces 114 and 116 (e.g., metallic leads or wires). In some examples, electrical component 112 may be a power source and conductive traces 114 and 116 may provide power to light source(s) 108. Additionally or alternatively, electrical component 112 may be a processor or control system and conductive traces 114 and 116 may be used to send signals to or receive signals from light source(s) 108. Although the figures generally illustrate ophthalmic devices/transparent circuit boards having light-emitting devices, the present disclosure is not so limited. For example, ophthalmic devices/transparent circuit boards of the present disclosure may include other types and forms of integrated circuit components (such as transistors, diodes, capacitors, resistors, sensors, antennas, batteries, or the like).

Light sensor(s) 110 may be positioned on or in frame 104 and may be directed at an expected position of the user's eye. There are five light sensors 110 illustrated in frame 104 around ophthalmic element 106 in the example shown in FIG. 1. However, the present disclosure is not limited to embodiments having five light sensors 110. For example, eye-tracking system 102 may include a single light sensor 110, fewer than five light sensors 110, or more than five light sensors 110. Moreover, in some embodiments, light sensor(s) 110 may be integrated into ophthalmic element 106.

Light sources 108 may be in predetermined locations in or across ophthalmic element 106 to enable eye-tracking system 102 to determine (e.g., calculate) where the user is looking by detecting (with light sensor(s) 110) and analyzing how light from light sources 108 reflect from the user's eye. Although twenty five light sources 108 are illustrated in FIG. 1, the present disclosure is not so limited. For example, additional light sources 108 may be positioned across substantially an entire area of ophthalmic element 106, such as to ensure at least some light reaches the user's eye no matter where on ophthalmic element 106 the user is gazing. In additional embodiments, fewer (e.g., one to three) light sources 108 may be positioned within the bounds of ophthalmic element 106. One or more light sources 108 may also be positioned on or in the frame 104, outside of the bounds of ophthalmic element 106, in addition to one or more light sources 108 within the bounds of ophthalmic element 106.

Figure 2:
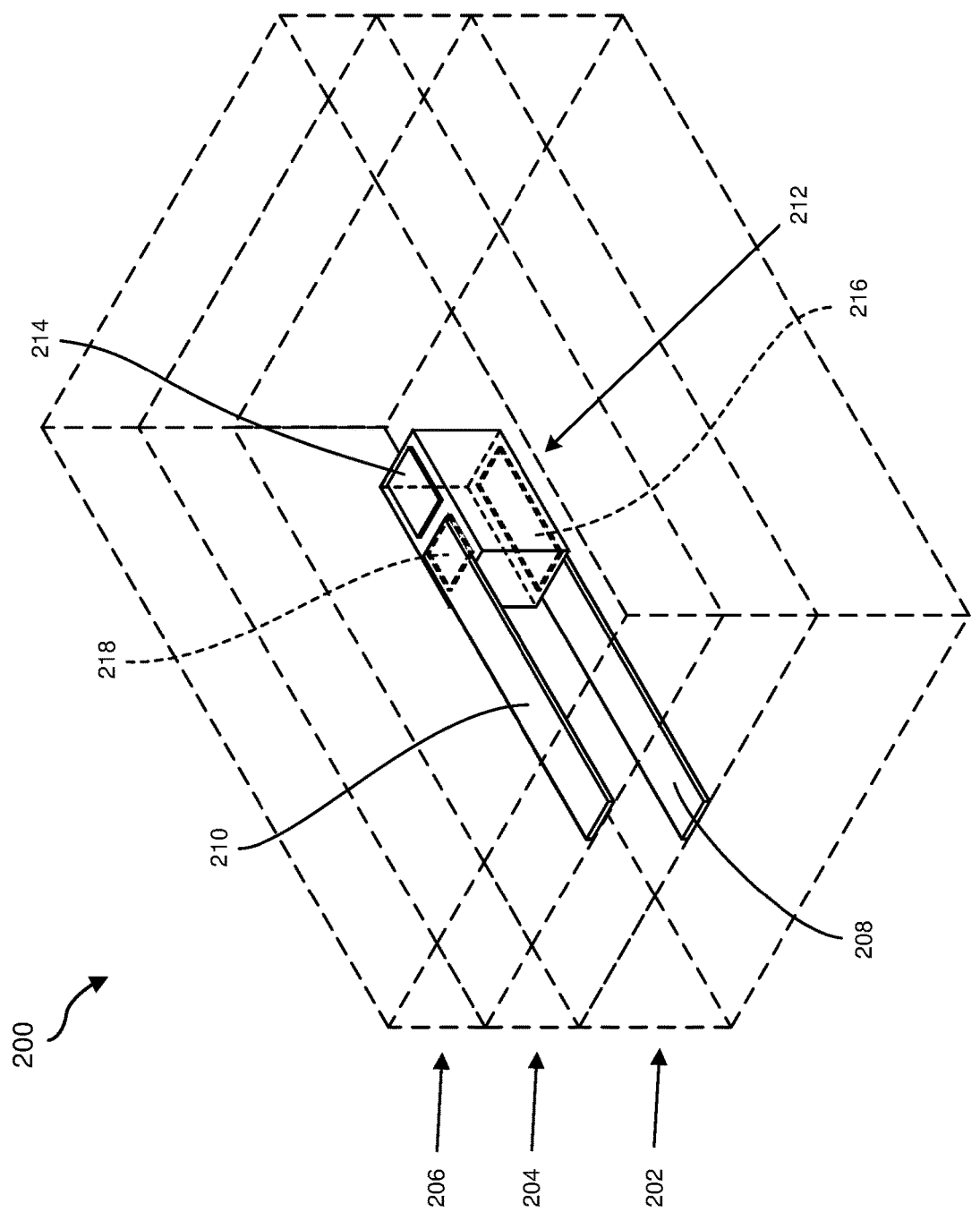
FIG. 2 shows a partially transparent perspective view of an exemplary transparent circuit board, according to at least one embodiment of the present disclosure.

FIG. 2 is a partially transparent perspective view of a portion of a transparent circuit board 200 having a light-emitting component 212 electrically coupled to a conductive trace 208, and a conductive trace 210. In some examples, transparent circuit board 200, light-emitting component 212, trace 208, and trace 210 may respectively represent ophthalmic element 106, light source 108, trace 114, and trace 116 in FIG. 1. As shown in FIG. 2, transparent circuit board 200 may include several transparent layers (e.g., a bottom transparent layer 202, a middle transparent layer 204, and a top transparent layer 206. In some examples, relational terms, such as "first," "second," "over," "top," "middle," "bottom," etc., may be used for clarity and convenience in understanding the disclosure and accompanying drawings and does not connote or depend on any specific preference, orientation, or order, except where the context clearly indicates otherwise.

Transparent layers 202, 204, and/or 206 may be formed from any transparent and electrically isolating material (e.g., a suitable glass, plastic, resin, sapphire, etc.). In some examples, bottom transparent layer 202, middle transparent layer 204, and/or top transparent layer 206 may exhibit greater than about 20% transmissivity and less than about 10% haze in the visible light spectrum. As shown, transparent circuit board 200 may also include one or more conductive traces (e.g., trace 208 and trace 210). In this example, trace 208 may be located between bottom transparent layer 202 and middle transparent layer 204, and trace 210 may be located between middle transparent layer 204 and top transparent layer 206. As shown, traces 208 and 210 may be stacked such that they overlap relative to the field-of-view of a user looking through transparent circuit board 200. Traces 208 and 210 may be formed from any suitable conductive material. In some examples, traces 208 and 210 may be formed from a conductive metal (e.g., gold, silver, etc.), a conductive oxide (e.g., indium tin oxide, fluorine doped tin oxide, doped zinc oxide, etc.), or a conductive polymer (e.g., polyacetylene, polyaniline, polypyrene, polythiophene, etc.). In some examples, "conductive" may refer to an ability of a material or structure to conduct electricity with a sheet resistance of less than about $10^6$ ohms/square.

Transparent circuit board 200 may also include one or more electrical components (e.g., light-emitting component 212). In this example, light-emitting component 212 may include a light emitter 214 oriented to shine light into a user's eye as the user looks through transparent circuit board 200, a bottom contact 216 (e.g., a metallic pad), and a top contact 218 (e.g., a metallic pad). In this example, some or all of light-emitting component 212 may be located within and/or encapsulated by middle transparent layer 204.

Figure 3:
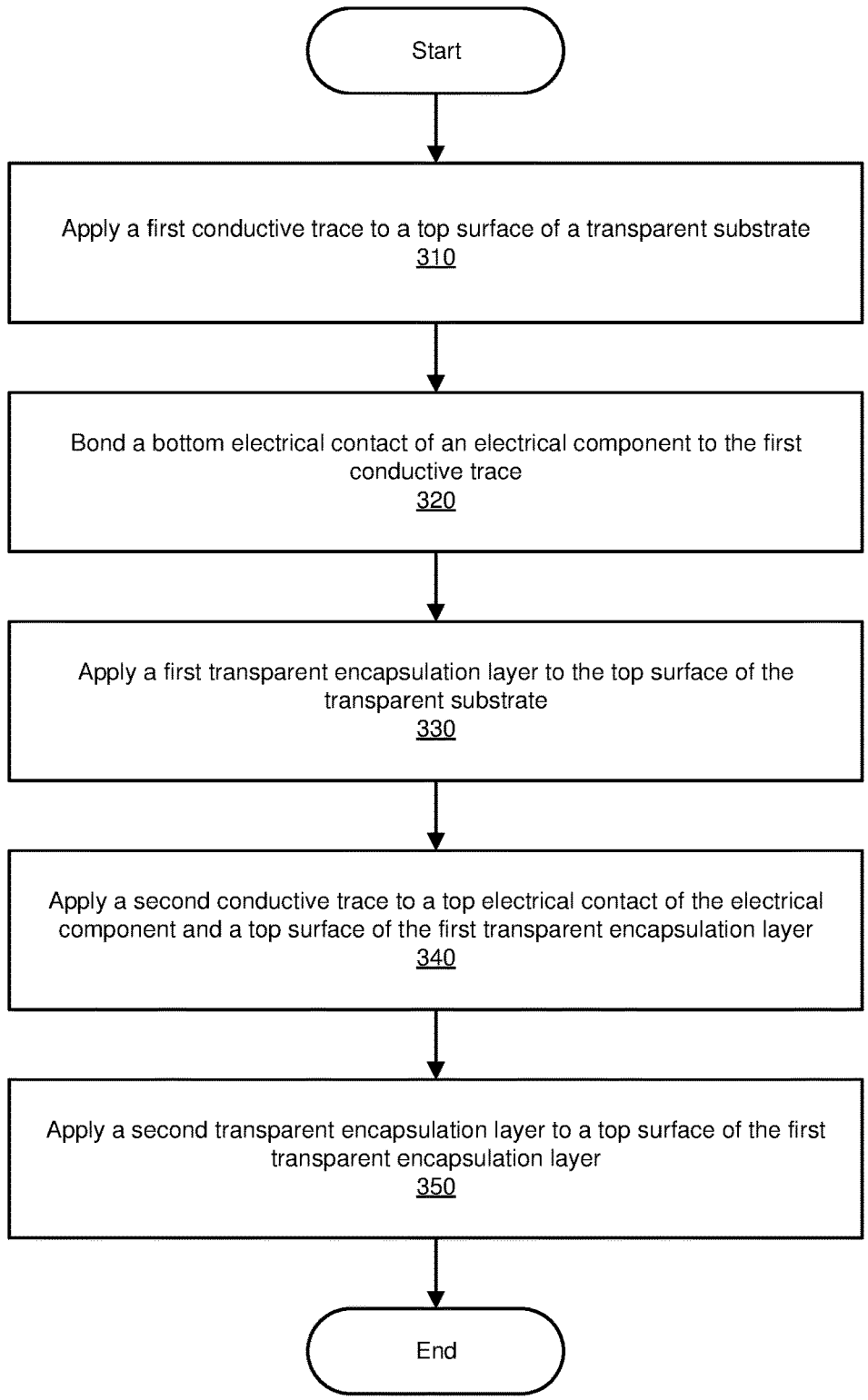
FIG. 3 is a flow diagram illustrating a method of fabricating the exemplary transparent circuit board of FIG. 2, according to at least one embodiment of the present disclosure.
Figure 4:
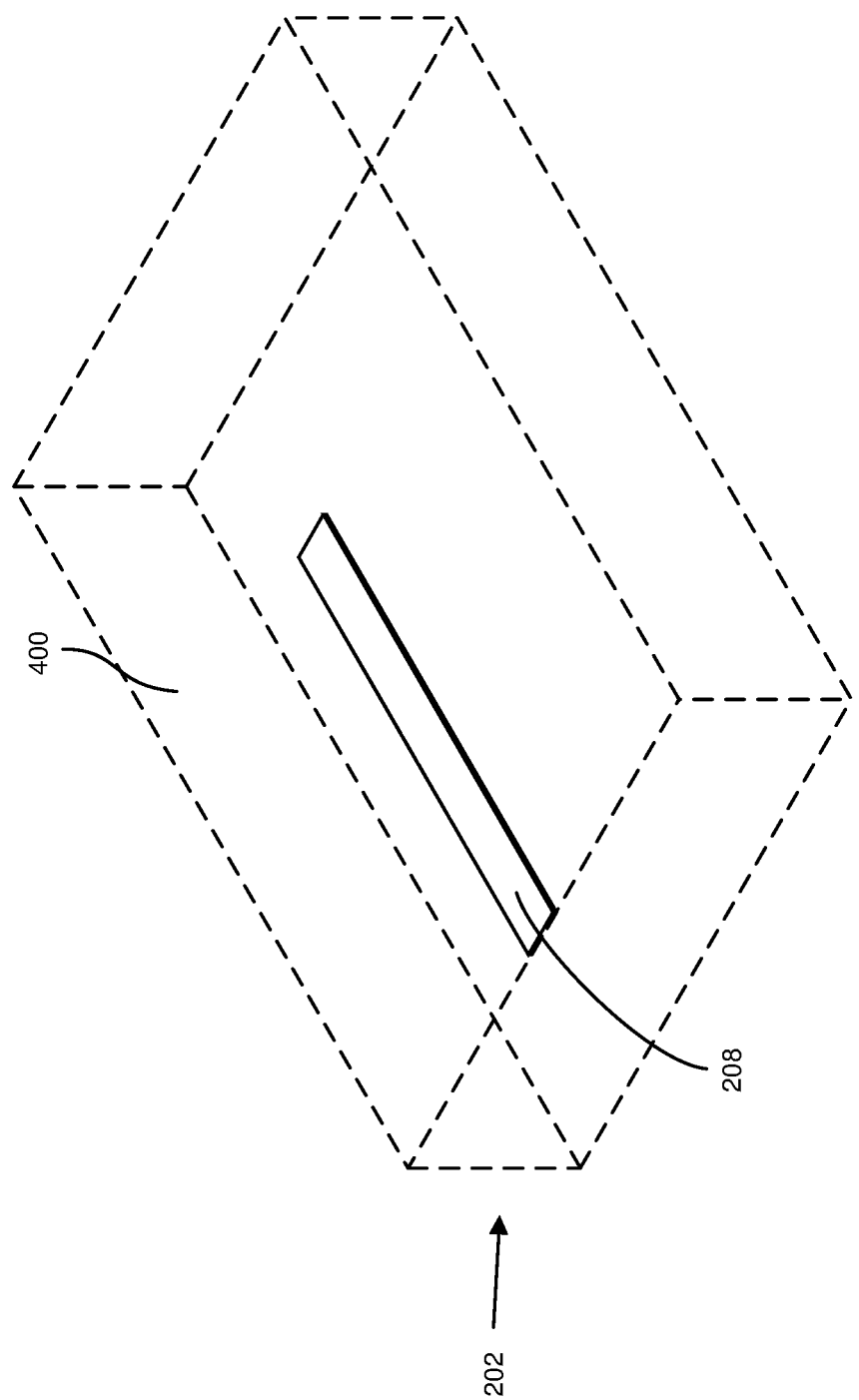
FIG. 4 shows a perspective view of an exemplary fabrication step of the exemplary transparent circuit board of FIG. 2, according to at least one embodiment of the present disclosure.

FIG. 3 is a flow diagram of an exemplary method 300 for fabricating transparent circuit board 200. Method 300 may include, at step 310, applying a first conductive trace to a top surface of a transparent substrate. For example, as shown in FIG. 4, conductive trace 208 may be applied to a top surface 400 of bottom transparent layer 202. Step 310 may be performed in a variety of ways. For example, conductive traces may be formed from at least one metallic material (such as gold, silver, titanium, copper, etc.), a conductive ceramic material, carbon nanotubes, nanowires, single- or multi-layer graphene, etc. Depending on the material used, a conductive trace may be deposited on a surface, such as by vapor phase deposition or liquid phase deposition. Some suitable vapor phase deposition techniques include sputtering, evaporation, and aerosol techniques. Example liquid phase deposition techniques include printing (e.g., spray coating, screen/gravure/inkjet printing), aerosol/spray coating, spin coating, dip coating, drop casting, doctor blading, surface functionalization self-assembly, templated self-assembly, etc. After or before deposition, conductive traces may be patterned, such as by forming a metallization layer and selectively removing portions of the metallization layer to define the conductive traces. By way of example and not limitation, patterning of conductive traces may be achieved by photopolymer liftoff/masking, soft lithography, shadow masking, wet chemical etching, dry chemical etching, and/or physical plasma etching.

Figure 5:
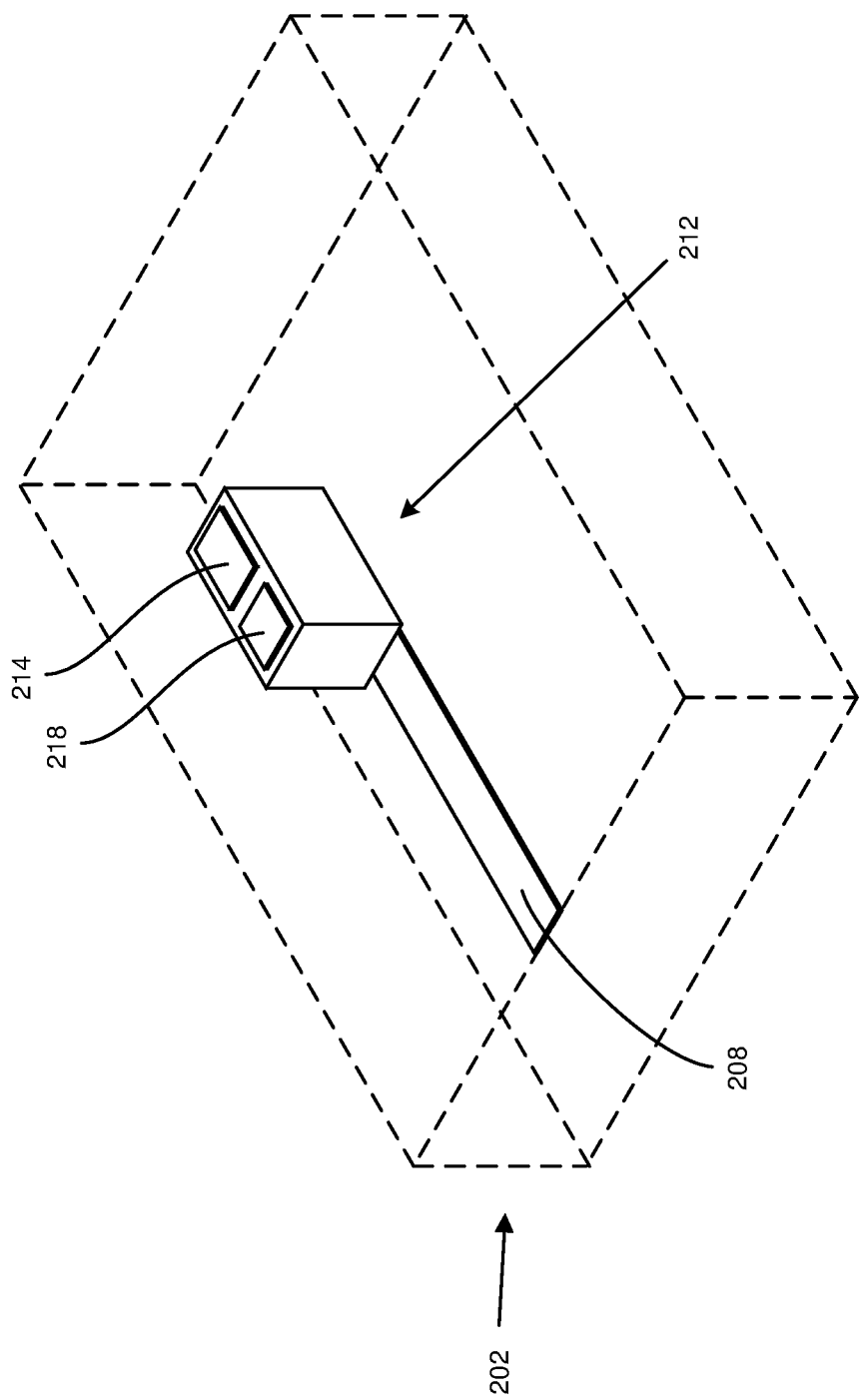
FIG. 5 shows a perspective view of another exemplary fabrication step of the exemplary transparent circuit board of FIG. 2, according to at least one embodiment of the present disclosure.
Figure 6:
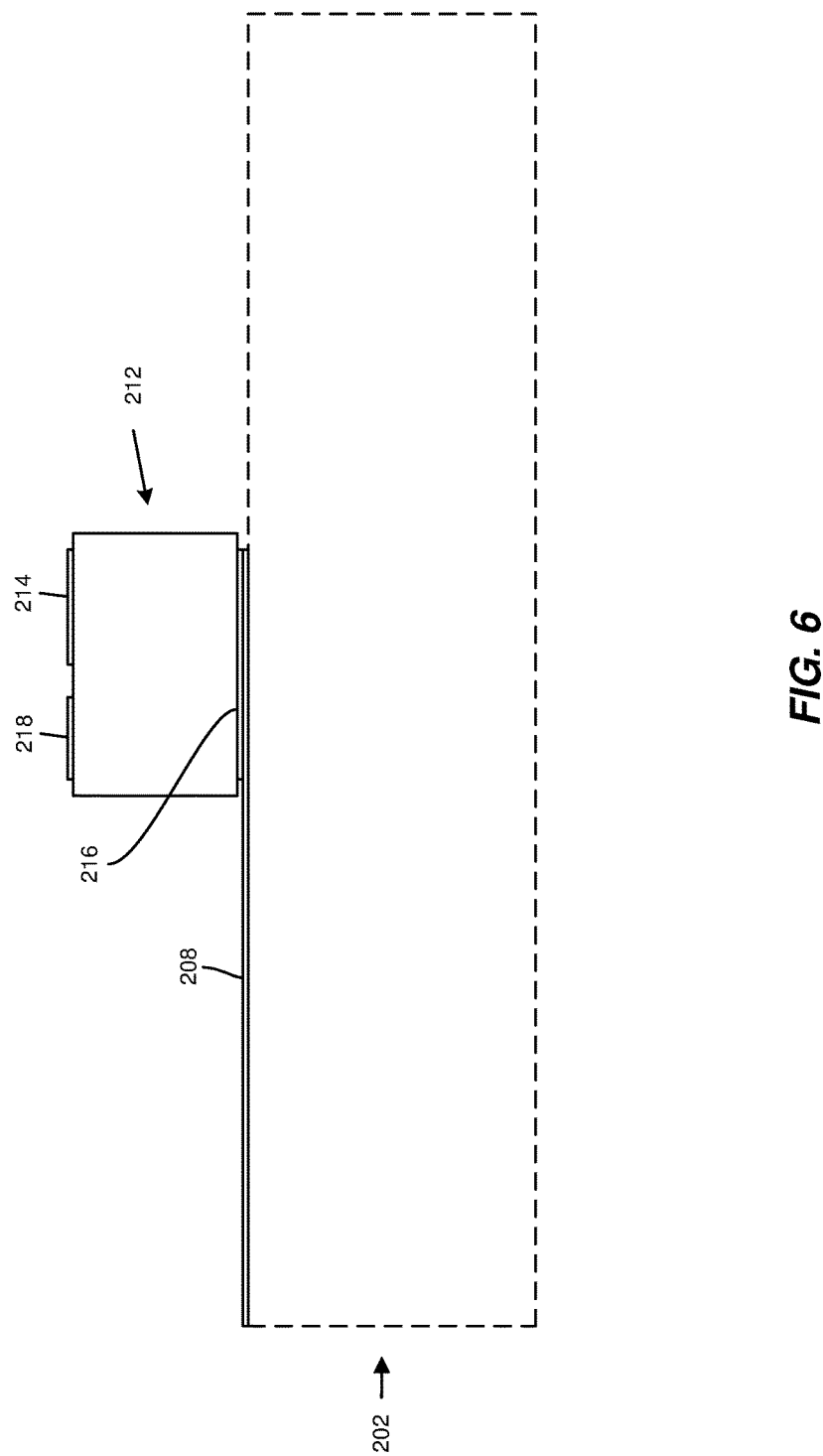
FIG. 6 shows a front view of the exemplary fabrication step of FIG. 5, according to at least one embodiment of the present disclosure.

Method 300 may further include, at step 320, bonding a bottom electrical contact of the electrical component to the first conductive trace. Step 320 may be performed using any suitable bonding technique (e.g., solder bonding or conductive adhesive bonding). For example, as shown in FIGS. 5 and 6, bottom contact 216 of light-emitting component 212 may be bonded to conductive trace 208 via a bonding agent (e.g., solder or a conductive adhesive material).

Figure 7:
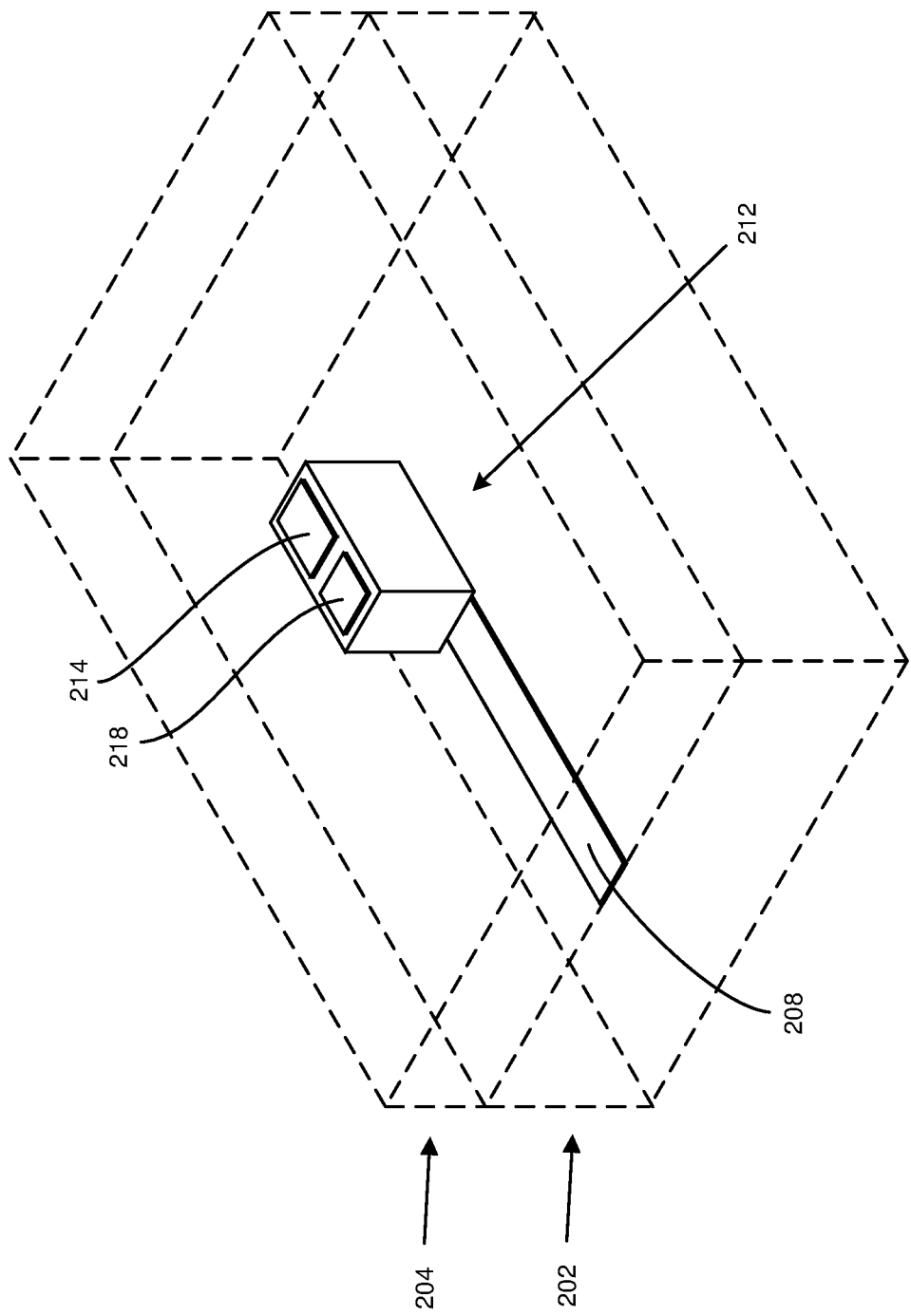
FIG. 7 shows a perspective view of another exemplary fabrication step of the exemplary transparent circuit board of FIG. 2, according to at least one embodiment of the present disclosure.
Figure 8:
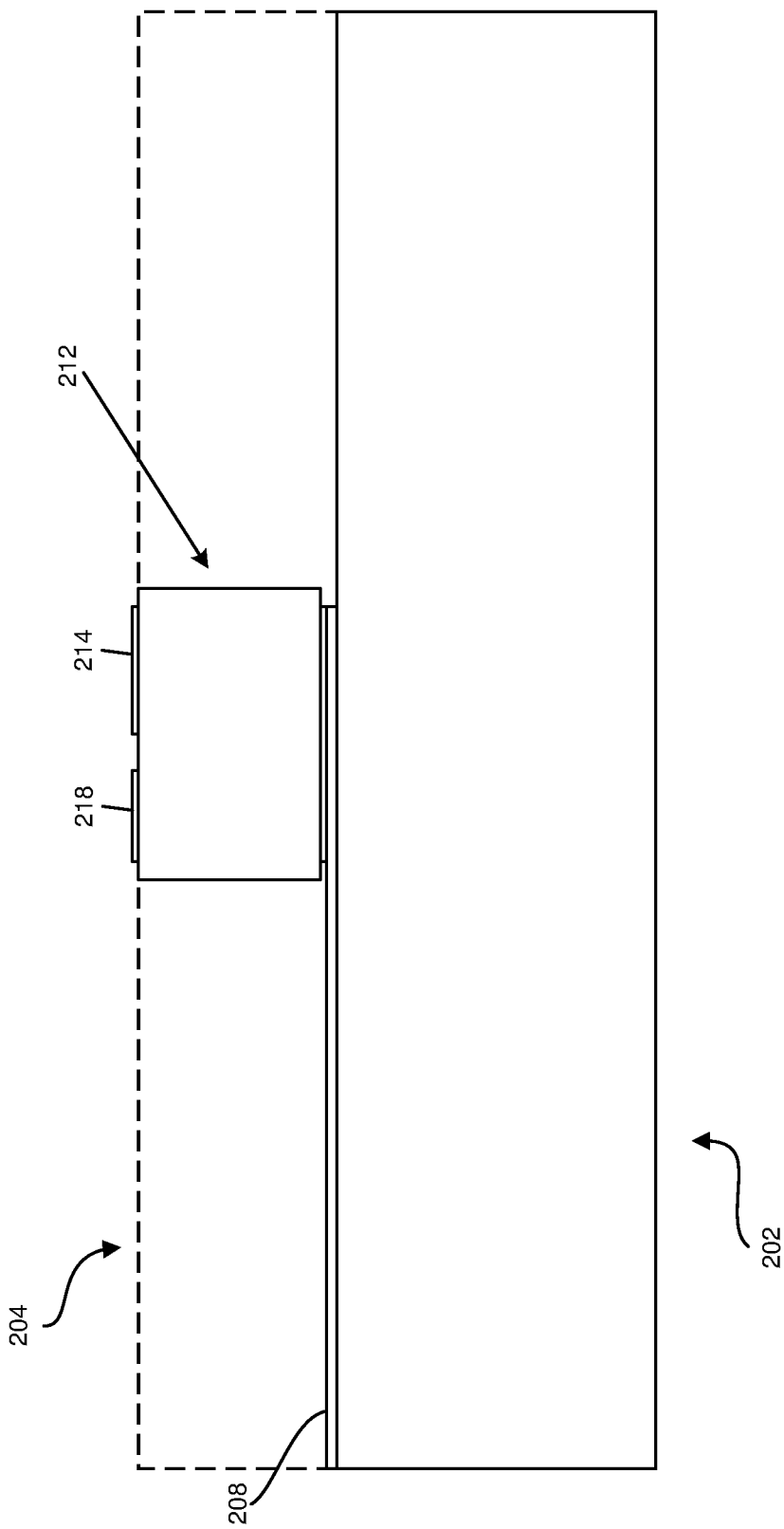
FIG. 8 shows a front view of the exemplary fabrication step of FIG. 7, according to at least one embodiment of the present disclosure.

Method 300 may further include, at step 330, applying a first transparent encapsulation layer to the top surface of the transparent substrate. For example, as shown in FIGS. 7 and 8, middle transparent layer 204 may be applied to top surface 400 of bottom transparent layer 202. Step 330 may be performed in a variety of ways. For example, transparent encapsulation layers may be fabricated as conformal films using a suitable thin-film deposition method, including, but not limited to, physical vapor deposition (e.g., evaporative deposition, ion beam assisted deposition, etc.), chemical vapor deposition, molecular beam epitaxy, sputter deposition, and the like. Additionally or alternatively, transparent encapsulation layers may be fabricated by encapsulating electrical components and traces, e.g., using an epoxy resin to provide environmental protection and/or electrical isolation. In some examples, a transparent encapsulation layer may be applied to a height equal to or just less than the height of an electrical component such that a top contact of the electrical component remains exposed (e.g., as illustrated in FIG. 8) or is easily exposed (e.g., by an etching process).

Figure 9:
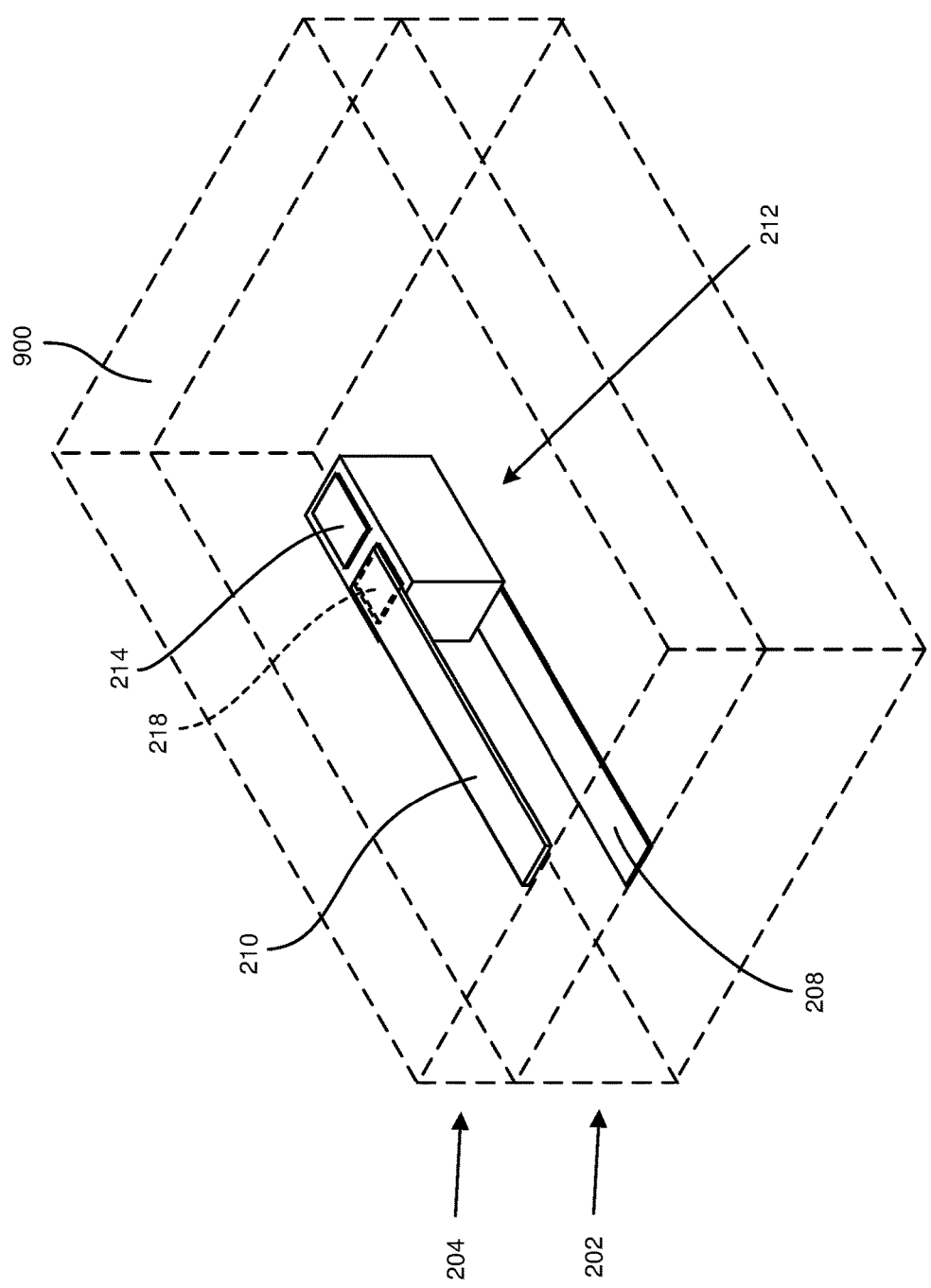
FIG. 9 shows a perspective view of another exemplary fabrication step of the exemplary transparent circuit board of FIG. 2, according to at least one embodiment of the present disclosure.
Figure 10:
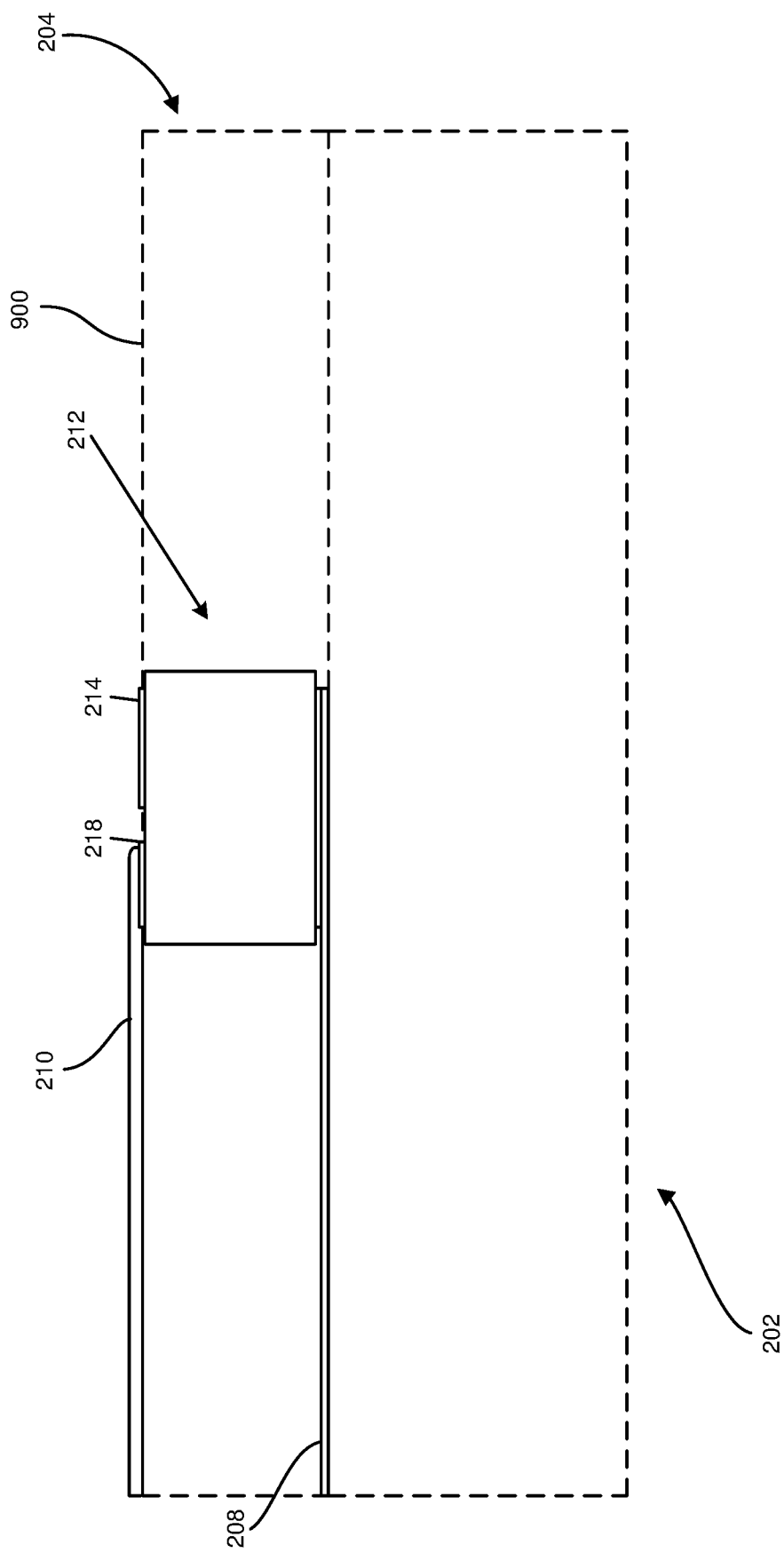
FIG. 10 shows a front view of the exemplary fabrication step of FIG. 9, according to at least one embodiment of the present disclosure.

Method 300 may include, at step 340, applying a second conductive trace to a top electrical contact of the electrical component and a top surface of the first transparent encapsulation layer. For example, as shown in FIGS. 9 and 10, trace 210 may be applied to a top surface 900 of middle transparent layer 204 and top contact 218. Step 340 may be similar to step 310 and may be performed using the same or similar techniques and methods. In some examples, the transparent layer over which the second conductive trace is applied may need to be etched in order to reveal the top electrical contact of the electrical component. Therefore, in some examples, the step of applying the second conductive trace may also include a preparatory etching process. In some examples, the first conductive trace and the second conductive trace may be stacked (e.g., positioned to overlap each other). Alternatively, the first conductive trace and the second conductive trace may run parallel but may not be overlapping.

Figure 11:
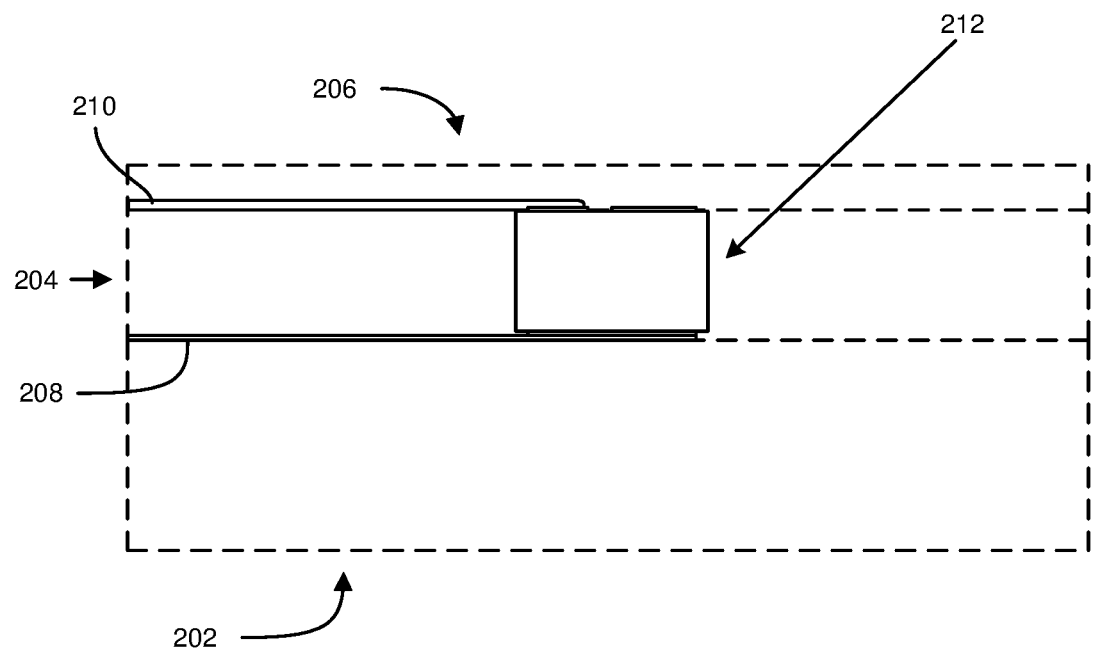
FIG. 11 shows a front view of another exemplary fabrication step of the exemplary transparent circuit board of FIG. 2, according to at least one embodiment of the present disclosure.

Method 300 may include, at step 350, applying a second transparent encapsulation layer to a top surface of the first transparent encapsulation layer. For example, as shown in FIG. 11, top transparent layer 206 may be applied to top surface 900 of middle transparent layer 204. Step 350 may be similar to step 330 and may be performed using similar techniques and methods.

Figure 12:
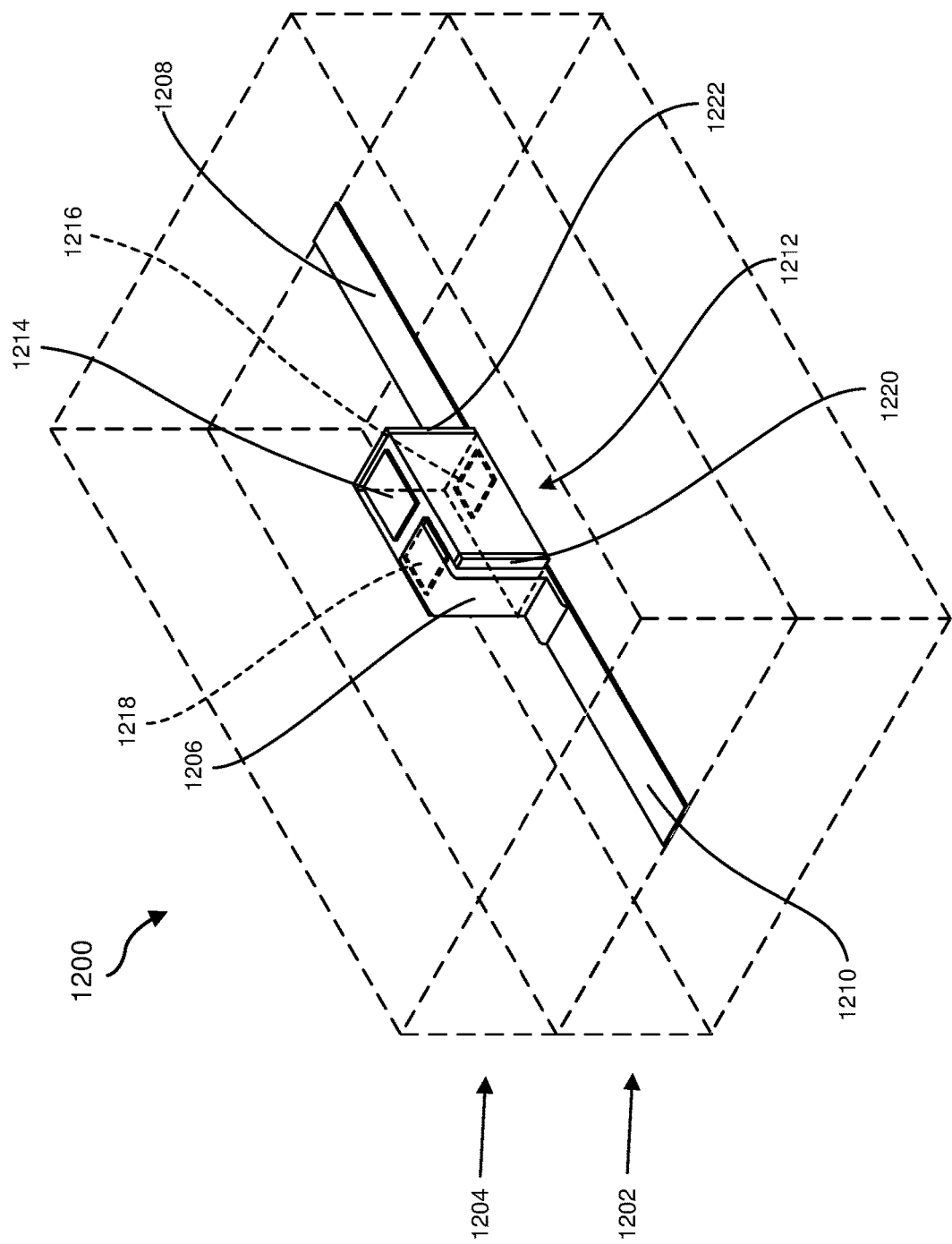
FIG. 12 shows a partially transparent perspective view of an exemplary transparent circuit board, according to at least one embodiment of the present disclosure.

FIG. 12 is a partially transparent perspective view of a portion of a transparent circuit board 1200 having a light-emitting component 1212 electrically coupled to a conductive trace 1208 and a conductive trace 1210. In some examples, transparent circuit board 1200, light-emitting component 1212, trace 1208, and trace 1210 may respectively represent ophthalmic element 106, light source 108, trace 114, and trace 116 in FIG. 1. As shown in FIG. 12, transparent circuit board 1200 may include several transparent layers (e.g., a bottom transparent layer 1202 and a top transparent layer 1204. Transparent layers 1202 and 1204 may be formed from any transparent and electrically isolating material (e.g., a suitable glass, plastic, resin, sapphire, etc.). In some examples, bottom transparent layer 1202 and/or top transparent layer 1204 may exhibit greater than about 20% transmissivity and less than about 10% haze in the visible light spectrum. As shown, transparent circuit board 1200 may also include one or more conductive traces (e.g., trace 1208 and trace 1210). In this example, trace 1208 and trace 1210 may be located between bottom transparent layer 1202 and top transparent layer 1204. Traces 1208 and 1210 may be formed from any suitable conductive material. In some examples, traces 1208 and 1210 may be formed from a conductive metal (e.g., gold, silver, etc.), a conductive oxide (e.g., indium tin oxide, fluorine doped tin oxide, doped zinc oxide, etc.), or a conductive polymer (e.g., polyacetylene, polyaniline, polypyrene, polythiophene, etc.).

Transparent circuit board 1200 may also include one or more electrical components (e.g., light-emitting component 1212). In this example, light-emitting component 1212 may include a light emitter 1214 oriented to shine light into a user's eye as the user looks through transparent circuit board 1200, a bottom contact 1216 (e.g., a metallic pad), and a top contact 1218 (e.g., a metallic pad). In this example, light-emitting component 1212 may be located within and/or encapsulated by top transparent layer 1204, and a conductive element 1206 (e.g., a conductive paste) may electrically couple top contact 1218 to trace 1210. In some examples, one or more surfaces of light-emitting component 1212 may be covered by a passivating element (e.g., a dielectric film or coating). In the example shown, light-emitting component 1212 may include a passivating surface 1220 and a passivating surface 1222. In this example, passivating surface 1220 may electrically isolate conductive element 1206 from light-emitting component 1212. Passivating surfaces 1220 and 1222 may be formed from any suitable insulating material (e.g., phosphosilicate glass, silicon dioxide, silicon nitride, aluminum oxide, hafnium oxide, etc.).

Figure 13:
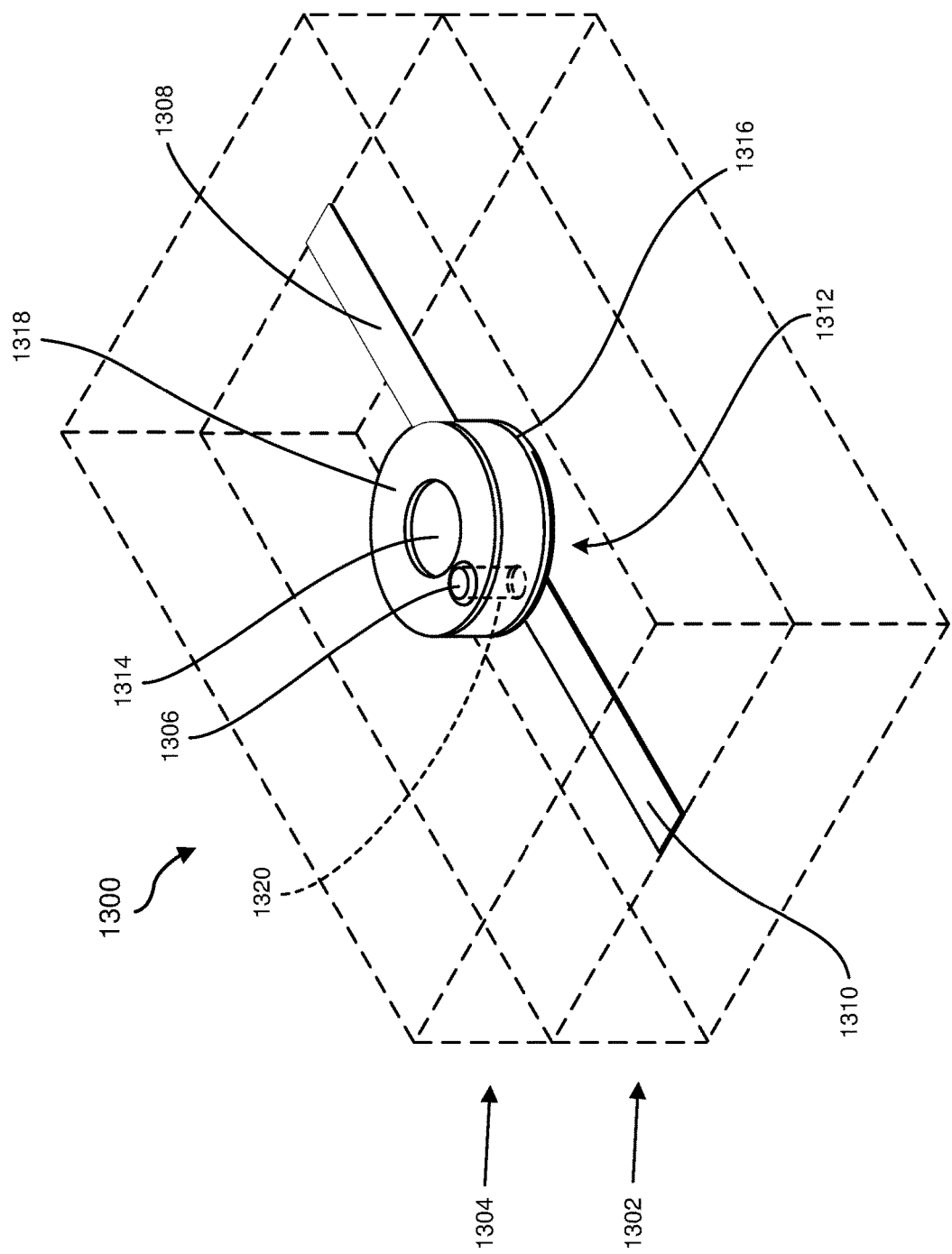
FIG. 13 shows a partially transparent perspective view of another exemplary transparent circuit board, according to at least one embodiment of the present disclosure.

FIG. 13 is a partially transparent perspective view of a portion of a transparent circuit board 1300 having a VCSEL 1312 electrically coupled to a conductive trace 1308 and a conductive trace 1310. In some examples, transparent circuit board 1300, VCSEL 1312, trace 1308, and trace 1310 may respectively represent ophthalmic element 106, light source 108, trace 114, and trace 116 in FIG. 1. As shown in FIG. 13, transparent circuit board 1300 may include several transparent layers (e.g., a bottom transparent layer 1302 and a top transparent layer 1304. Transparent layers 1302 and 1304 may be formed from any transparent and electrically isolating material (e.g., a suitable glass, plastic, resin, sapphire, etc.). In some examples, bottom transparent layer 1302 and/or top transparent layer 1304 may exhibit greater than about 20% transmissivity and less than about 10% haze in the visible light spectrum. As shown, transparent circuit board 1300 may also include one or more conductive traces (e.g., trace 1308 and trace 1310). In this example, trace 1308 and trace 1310 may be located between bottom transparent layer 1302 and top transparent layer 1304. Traces 1308 and 1310 may be formed from any suitable conductive material. In some examples, traces 1308 and 1310 may be formed from a conductive metal (e.g., gold, silver, etc.), a conductive oxide (e.g., indium tin oxide, fluorine doped tin oxide, doped zinc oxide, etc.), or a conductive polymer (e.g., polyacetylene, polyaniline, polypyrene, polythiophene, etc.).

Figure 14:
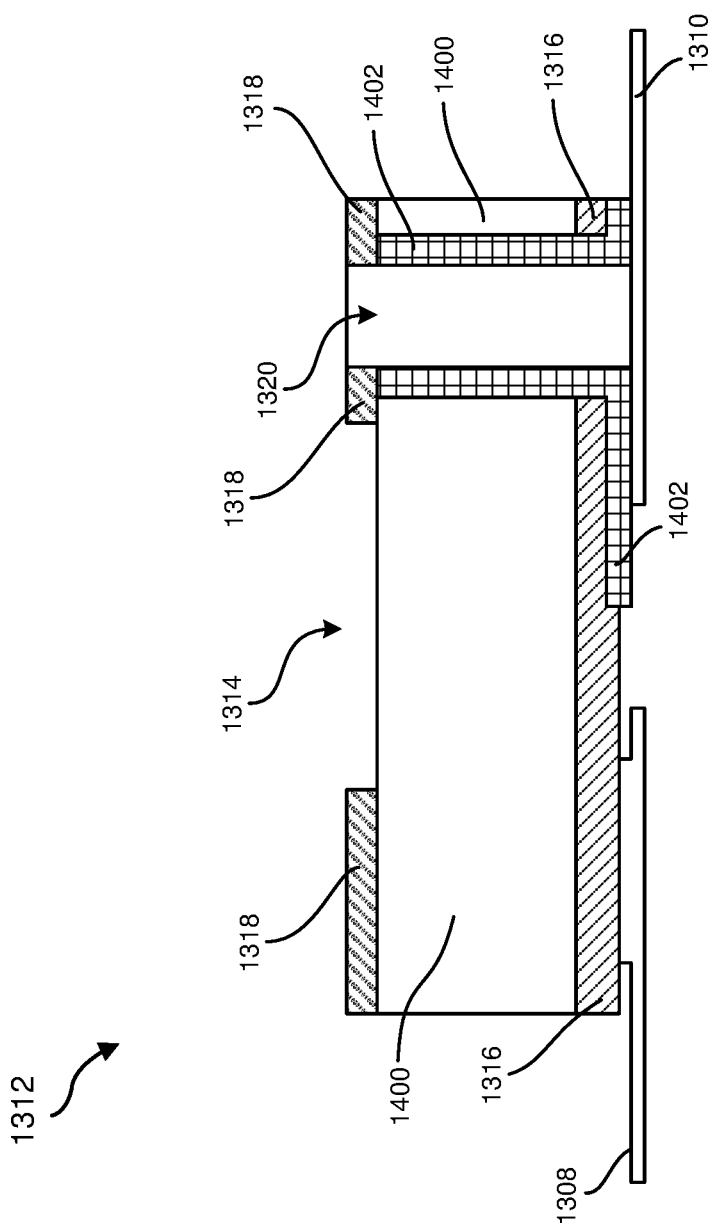
FIG. 14 shows a cross-sectional view of an exemplary electrical component, according to at least one embodiment of the present disclosure.

Transparent circuit board 1300 may also include one or more electrical components (e.g., VCSEL 1312). In this example, VCSEL 1312 may include a light-emitting surface 1314 oriented to shine light into a user's eye as the user looks through transparent circuit board 1300, a bottom contact 1316 (e.g., a metallic contact), and a top contact 1318 (e.g., a metallic contact). In this example, VCSEL 1312 may be located within and/or encapsulated by top transparent layer 1304, and a conductive element 1306 (e.g., a conductive paste) may electrically couple top contact 1318 to trace 1310 through a channel 1320 within VCSEL 1312. In some examples, channel 1320 may extend from the top of VCSEL 1312 to the bottom of VCSEL 1312 as shown in FIGS. 13 and 14. Channel 1320 may be covered by a passivating element (e.g., a dielectric film or coating). As shown in FIG. 14, VCSEL 1312 may include light-generating layers 1400 (e.g., a quantum well (QW) active cavity area that is confined by two or more distributed Bragg reflectors) and a passivating surface 1402. In this example, passivating surface 1402 may line channel 1320 and electrically isolate conductive element 1306, when applied, from light-generating layers 1400 and/or bottom contact 1316 from trace 1310.

Figure 15:
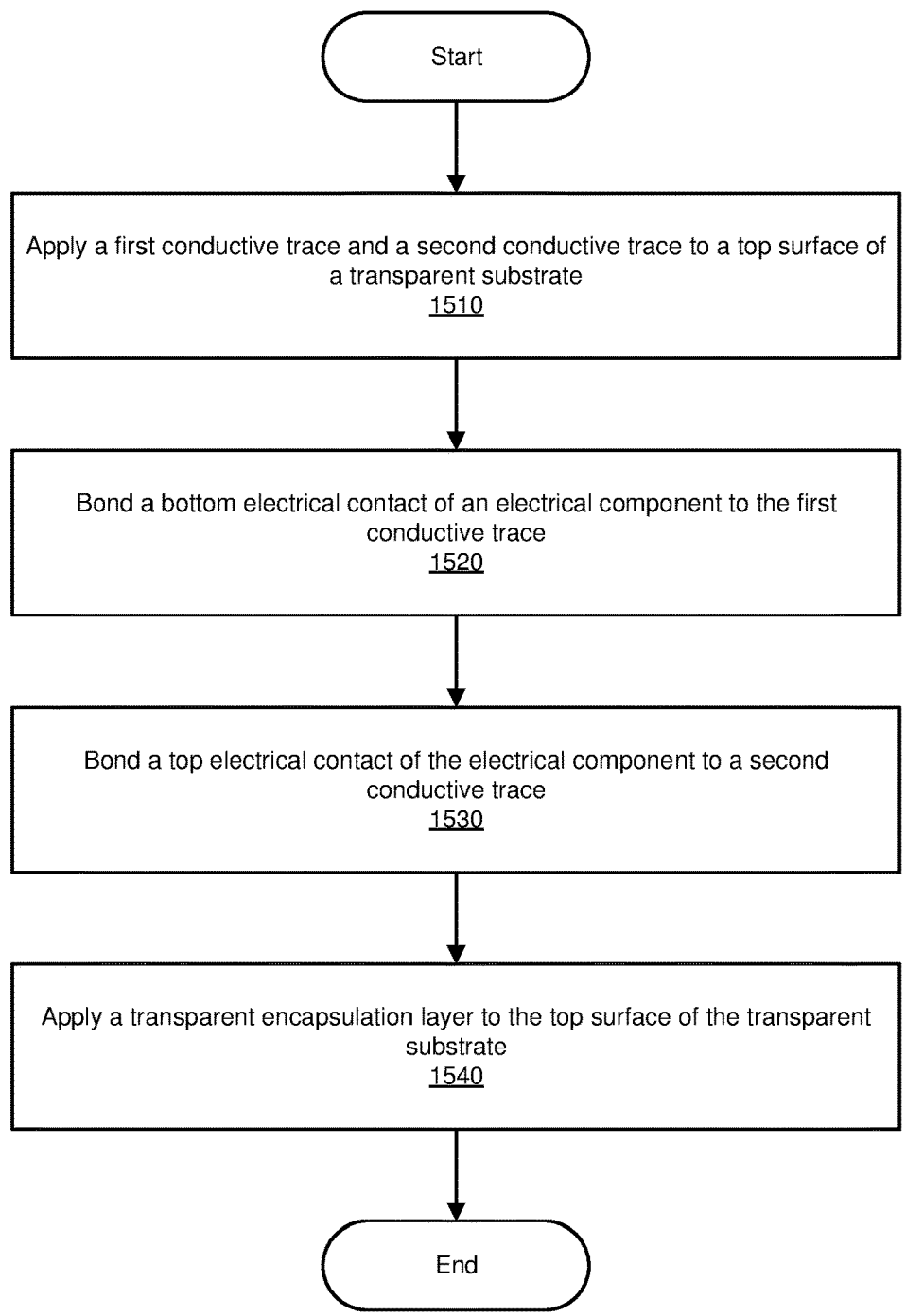
FIG. 15 is a flow diagram illustrating a method of fabricating the exemplary transparent circuit board of FIGS. 12 and/or 13, according to at least one embodiment of the present disclosure.
Figure 16:
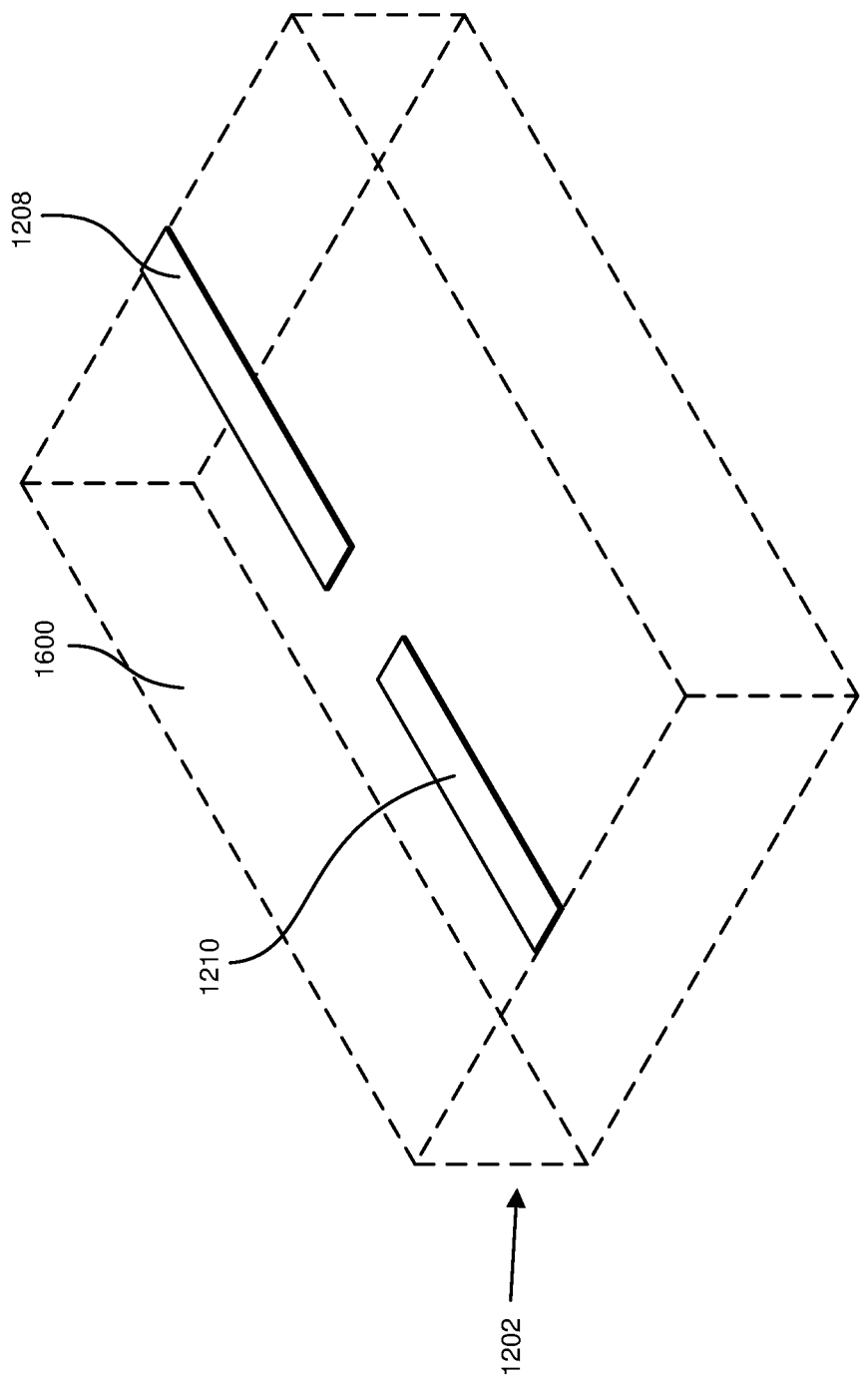
FIG. 16 shows a perspective view of an exemplary fabrication step of the exemplary transparent circuit board of FIG. 12, according to at least one embodiment of the present disclosure.
Figure 22:
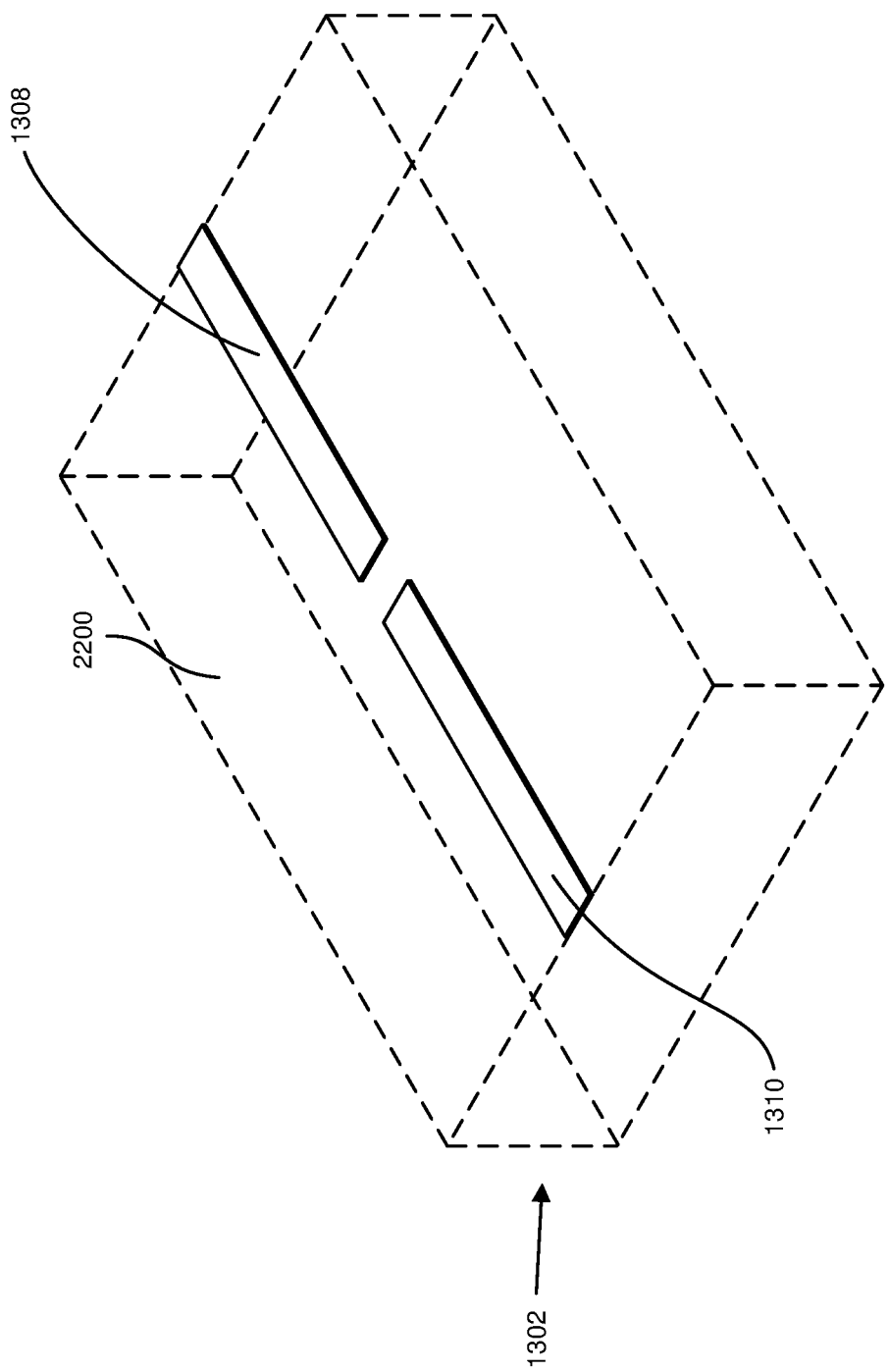
FIG. 22 shows a perspective view of an exemplary fabrication step of the exemplary transparent circuit board of FIG. 13, according to at least one embodiment of the present disclosure.

FIG. 15 is a flow diagram of an exemplary method 1500 for fabricating transparent circuit board 1200 in FIG. 12 or transparent circuit board 1300 in FIG. 13. Method 1500 may include, at step 1510, applying a first conductive trace and a second conductive trace to a top surface of a transparent substrate. For example, as shown in FIG. 16, conductive traces 1208 and 1210 may be applied to a top surface 1600 of bottom transparent layer 1202. Similarly, as shown in FIG. 22, conductive traces 1308 and 1310 may be applied to a top surface 2200 of bottom transparent layer 1302. Step 1510 may be similar to step 310 in FIG. 3 and may be performed using the same or similar techniques and methods.

Figure 17:
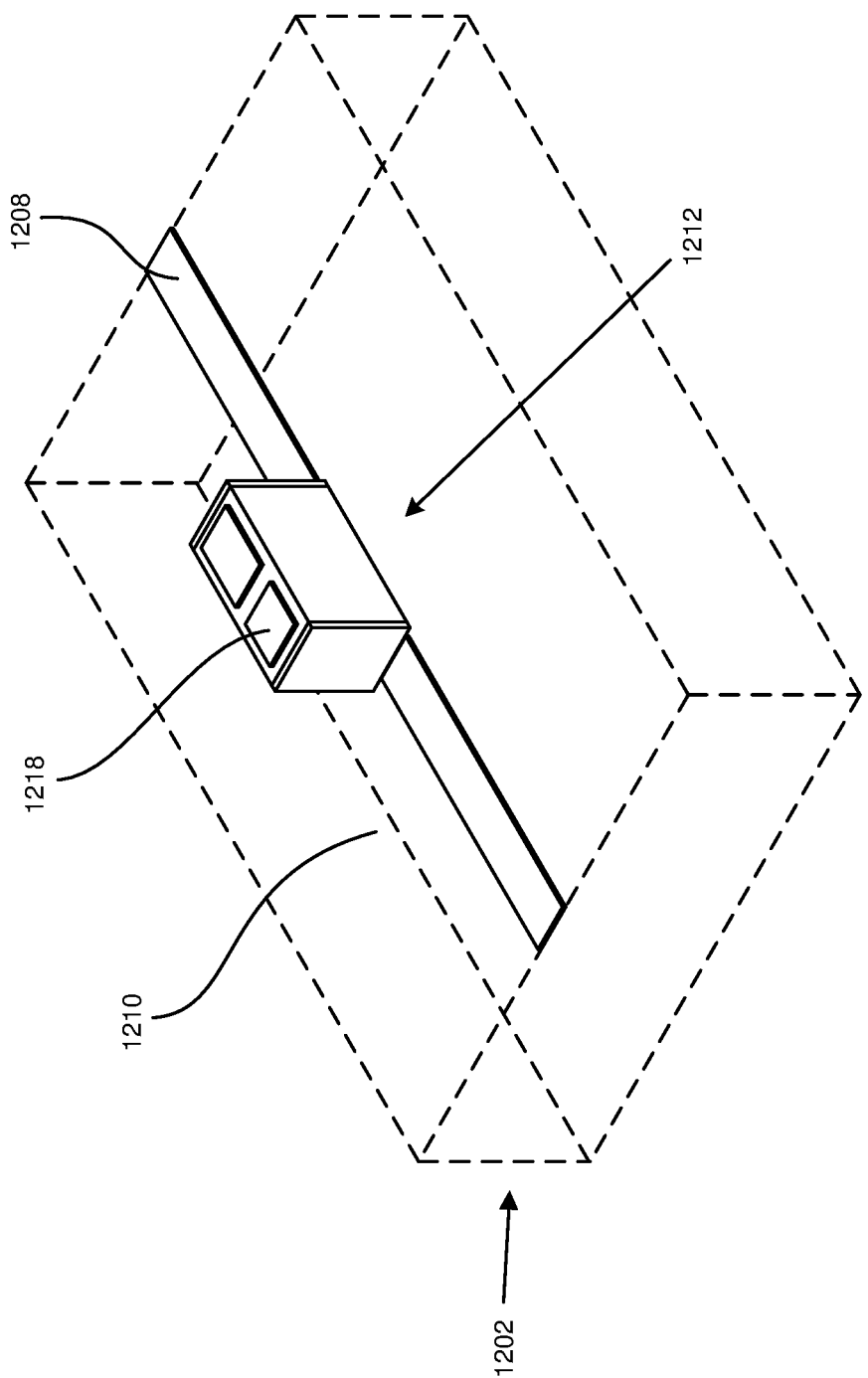
FIG. 17 shows a perspective view of another exemplary fabrication step of the exemplary transparent circuit board of FIG. 12, according to at least one embodiment of the present disclosure.
Figure 18:
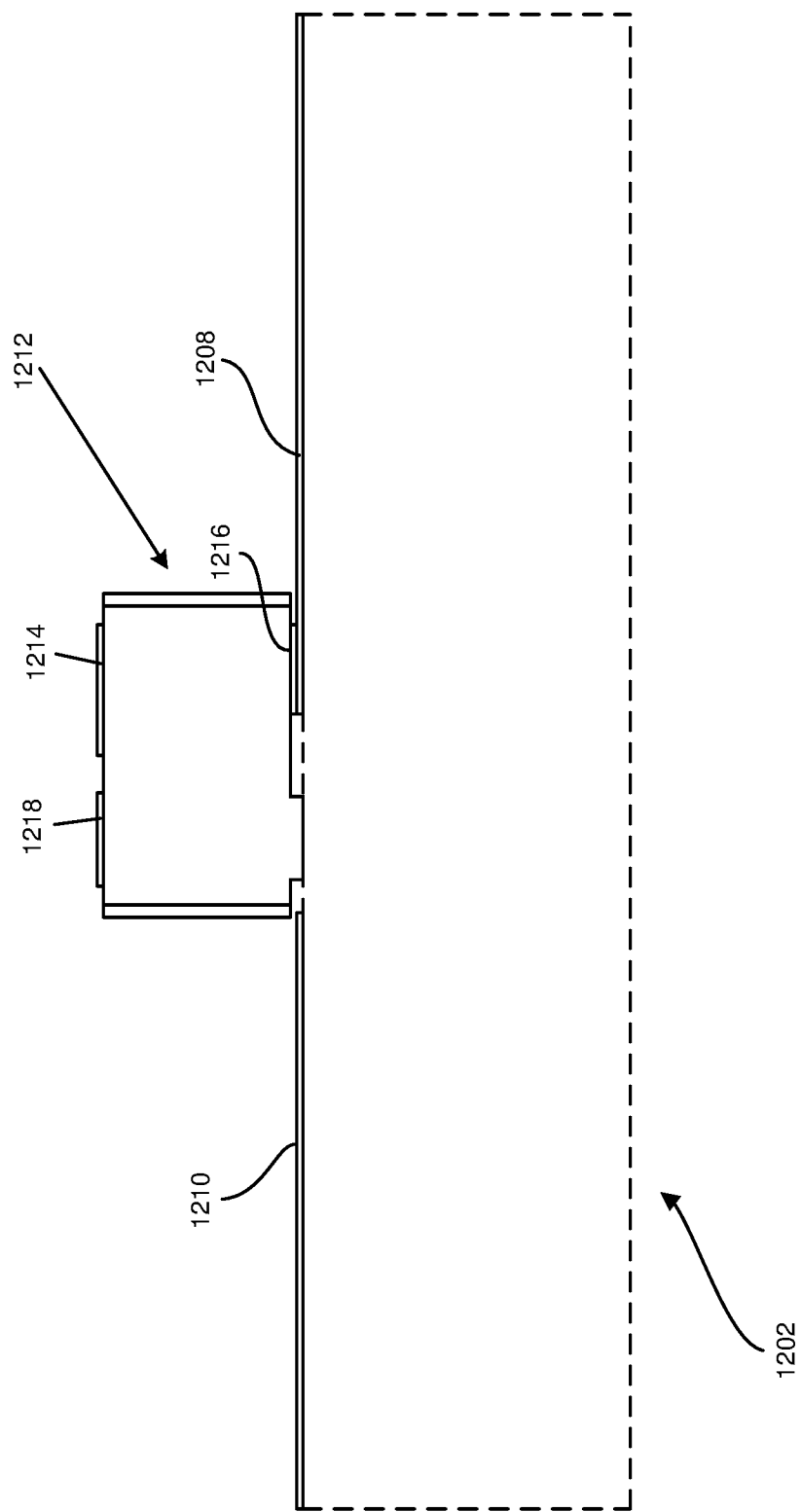
FIG. 18 shows a front view of the exemplary fabrication step of FIG. 17, according to at least one embodiment of the present disclosure.
Figure 23:
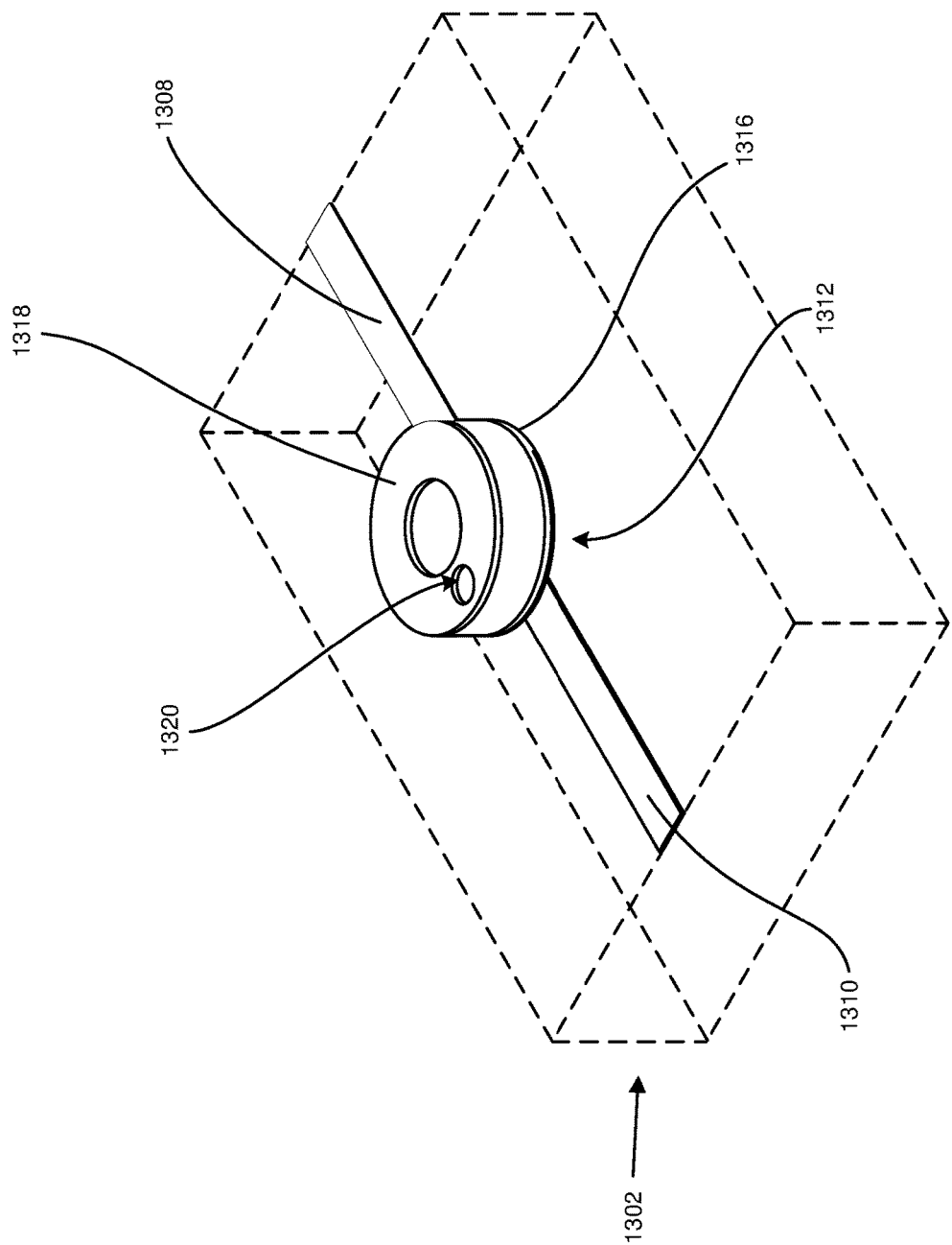
FIG. 23 shows a perspective view of another exemplary fabrication step of the exemplary transparent circuit board of FIG. 13, according to at least one embodiment of the present disclosure.

Method 1500 may include, at step 1520, bonding a bottom electrical contact of an electrical component to the first conductive trace. For example, as shown in FIGS. 17 and 18, bottom contact 1216 of light-emitting component 1212 may be bonded to conductive trace 1208. Similarly, as shown in FIG. 23, bottom contact 1316 of VCSEL 1312 may be bonded to conductive trace 1308. Step 1520 may be similar to step 320 in FIG. 3 and may be performed using the same or similar techniques and methods.

Figure 19:
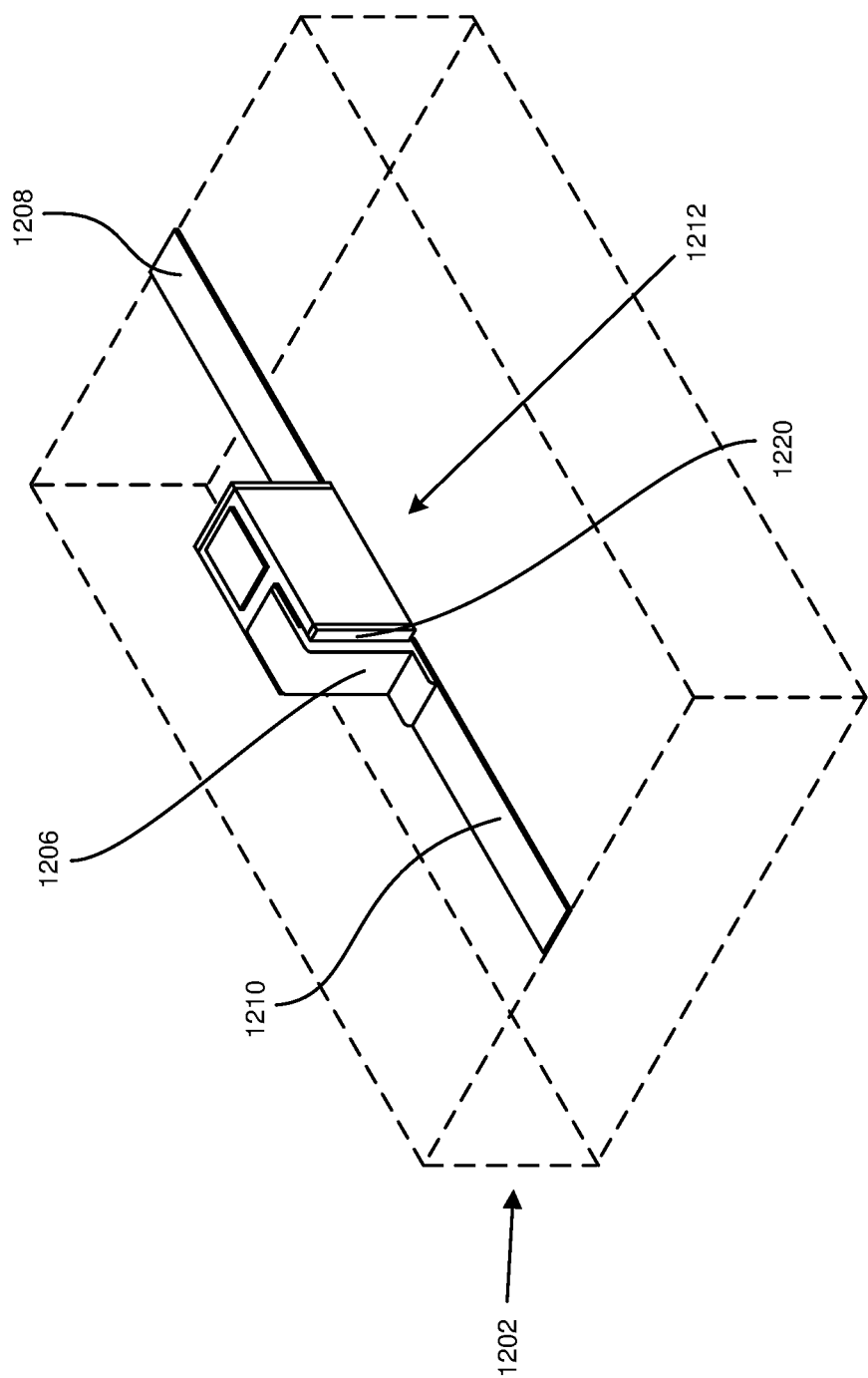
FIG. 19 shows a perspective view of another exemplary fabrication step of the exemplary transparent circuit board of FIG. 12, according to at least one embodiment of the present disclosure.
Figure 20:
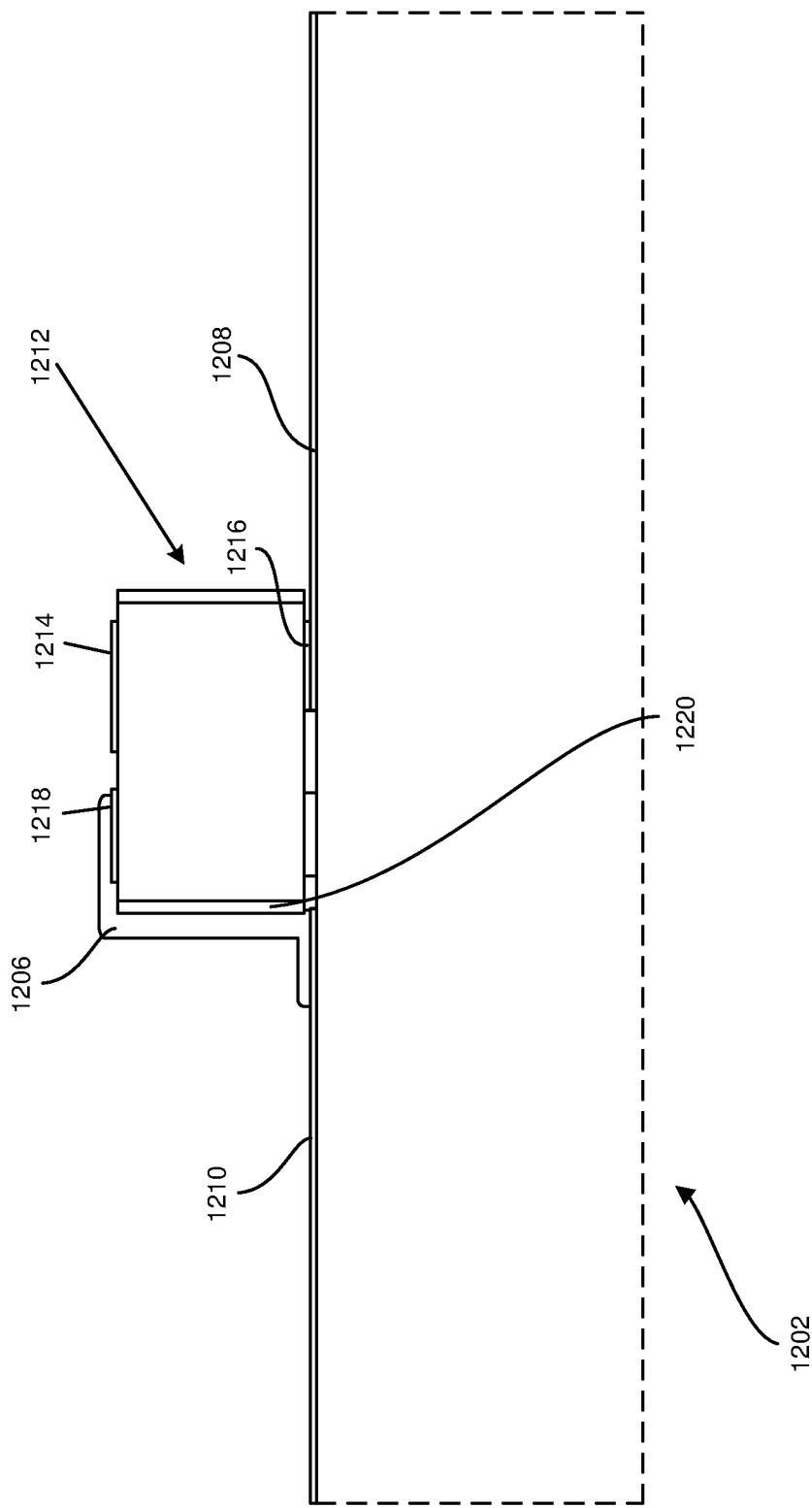
FIG. 20 shows a front view of the exemplary fabrication step of FIG. 19, according to at least one embodiment of the present disclosure.
Figure 24:
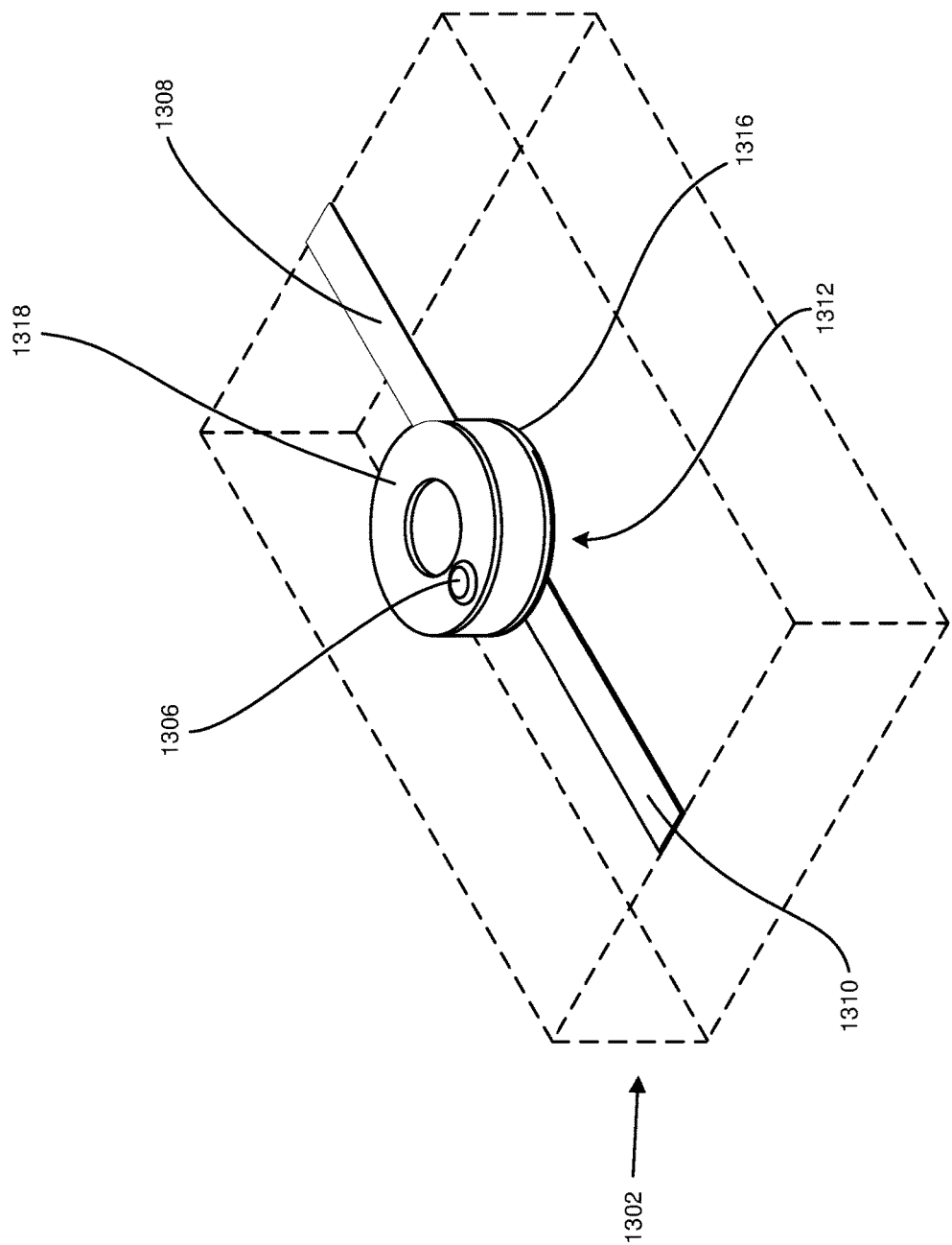
FIG. 24 shows a perspective view of another exemplary fabrication step of the exemplary transparent circuit board of FIG. 13, according to at least one embodiment of the present disclosure.
Figure 25:
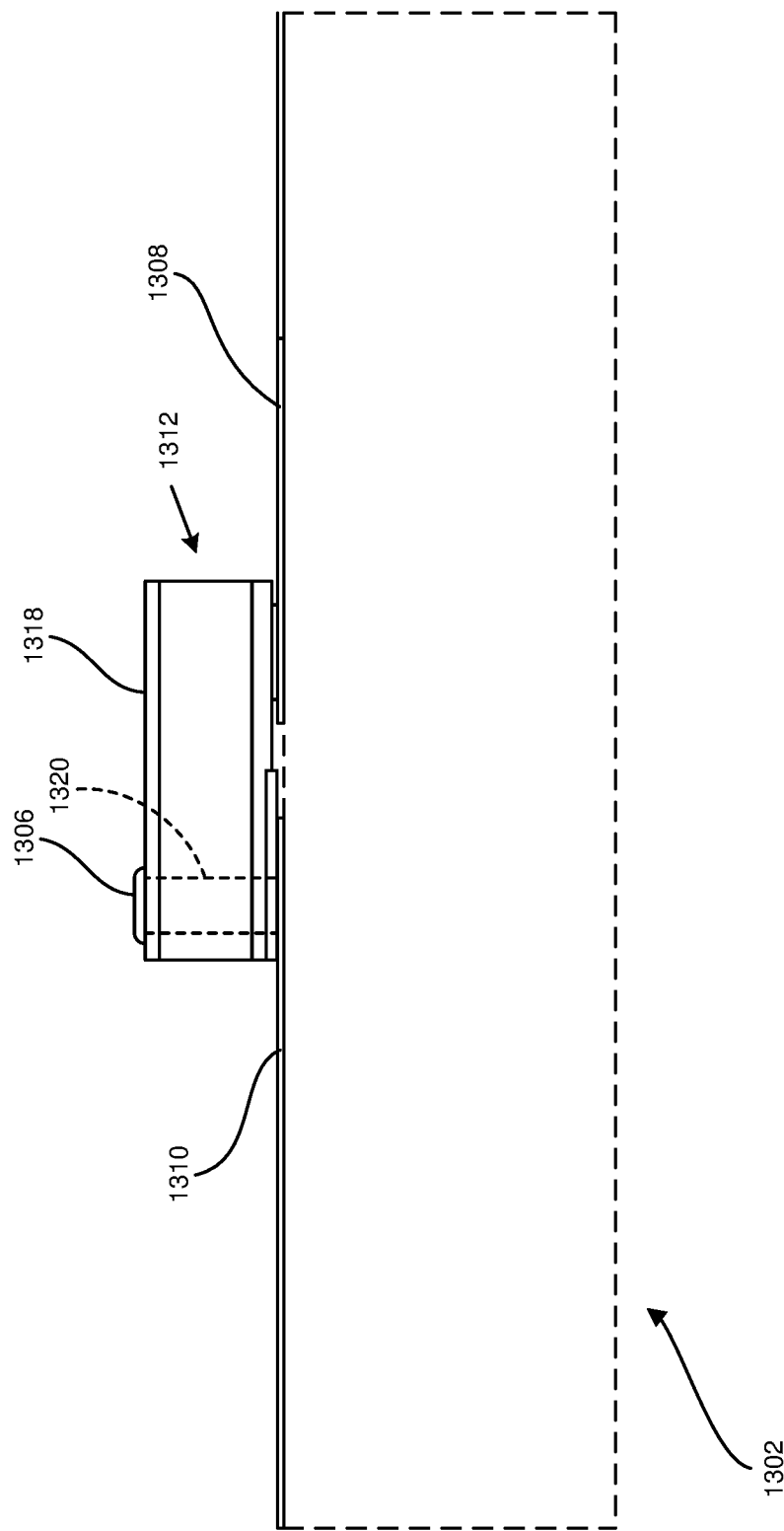
FIG. 25 shows a partially transparent front view of the exemplary fabrication step of FIG. 24, according to at least one embodiment of the present disclosure.

Method 1500 may include, at step 1530, bonding a top electrical contact of the electrical component to the second conductive trace. For example, as shown in FIGS. 19 and 20, conductive element 1206 may be applied to top contact 1218 of light-emitting component 1212, trace 1210, and passivating surface 1220 to bond top contact 1218 to trace 1210. Similarly, as shown in FIGS. 24 and 25, conductive element 1306 may be applied to trace 1310 and top contact 1318 of VCSEL 1312 via channel 1320 to bond top contact 1218 to trace 1210. In some examples, conductive element 1206 and conductive element 1306 may be a conductive epoxy, paste, or glue and may be applied using a suitable technique. Additionally or alternatively, conductive element 1206 and conductive element 1306 may be similar to traces 1208 and 1210 and/or traces 1308 and 1310 and may be applied in a similar manner.

Figure 21:
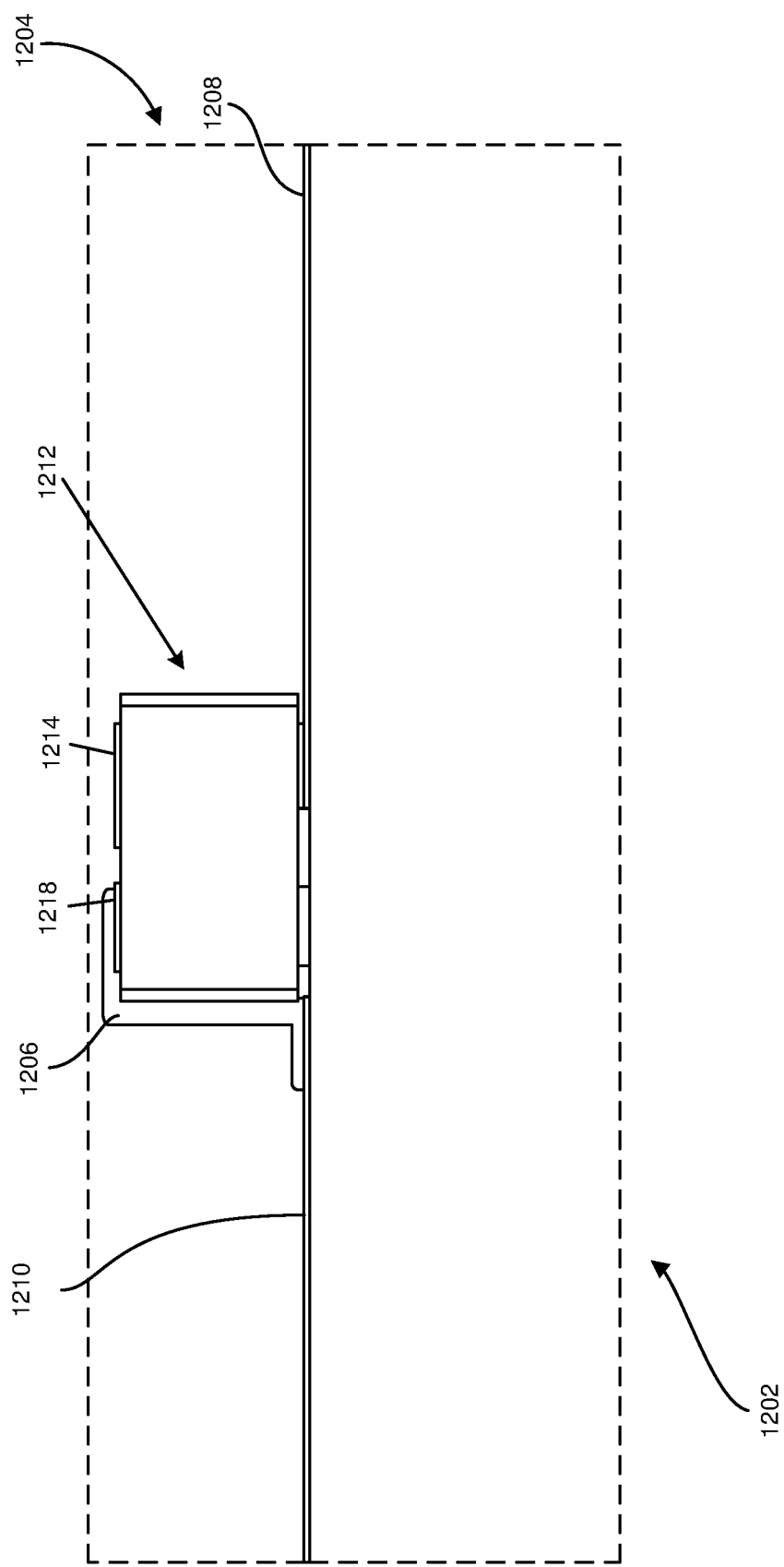
FIG. 21 shows a front view of another exemplary fabrication step of the exemplary transparent circuit board of FIG. 12, according to at least one embodiment of the present disclosure.

Method 1500 may include, at step 1540, applying a transparent encapsulation layer to the top surface of the transparent substrate. For example, as shown in FIG. 21, top transparent layer 1204 may be applied to top surface 1600 of bottom transparent layer 1202. Similarly, as shown in FIG. 26, top transparent layer 1304 may be applied to top surface 2200 of bottom transparent layer 1302. Step 1540 may be similar to step 350 in FIG. 3 and may be performed using the same or similar techniques and methods.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 2700 in FIG. 27. Other artificial reality systems may include a NED that also provides visibility into the real world (e.g., augmented-reality system 2800 in FIG. 28) or that visually immerses a user in an artificial reality (e.g., virtual-reality system 2900 in FIG. 29). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Turning to FIG. 27, augmented-reality system 2700 generally represents a wearable device dimensioned to fit about a body part (e.g., a head) of a user. As shown in FIG. 27, system 2700 may include a frame 2702 and a camera assembly 2704 that is coupled to frame 2702 and configured to gather information about a local environment by observing the local environment. Augmented-reality system 2700 may also include one or more audio devices, such as output audio transducers 2708(A) and 2708(B) and input audio transducers 2710. Output audio transducers 2708(A) and 2708(B) may provide audio feedback and/or content to a user, and input audio transducers 2710 may capture audio in a user's environment.

As shown, augmented-reality system 2700 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 2700 may not include a NED, augmented-reality system 2700 may include other types of screens or visual feedback devices (e.g., a display screen integrated into a side of frame 2702).

The embodiments discussed in this disclosure may also be implemented in augmented-reality systems that include one or more NEDs. For example, as shown in FIG. 28, augmented-reality system 2800 may include an eyewear device 2802 with a frame 2810 configured to hold a left display device 2815(A) and a right display device 2815(B) in front of a user's eyes. Display devices 2815(A) and 2815(B) may act together or independently to present an image or series of images to a user. While augmented-reality system 2800 includes two displays, embodiments of this disclosure may be implemented in augmented-reality systems with a single NED or more than two NEDs.

In some embodiments, augmented-reality system 2800 may include one or more sensors, such as sensor 2840. Sensor 2840 may generate measurement signals in response to motion of augmented-reality system 2800 and may be located on substantially any portion of frame 2810. Sensor 2840 may represent a position sensor, an inertial measurement unit (IMU), a depth camera assembly, or any combination thereof. In some embodiments, augmented-reality system 2800 may or may not include sensor 2840 or may include more than one sensor. In embodiments in which sensor 2840 includes an IMU, the IMU may generate calibration data based on measurement signals from sensor 2840. Examples of sensor 2840 may include, without limitation, accelerometers, gyroscopes, magnetometers, other suitable types of sensors that detect motion, sensors used for error correction of the IMU, or some combination thereof.

Augmented-reality system 2800 may also include a microphone array with a plurality of acoustic transducers 2820(A)-2820(J), referred to collectively as acoustic transducers 2820. Acoustic transducers 2820 may be transducers that detect air pressure variations induced by sound waves. Each acoustic transducer 2820 may be configured to detect sound and convert the detected sound into an electronic format (e.g., an analog or digital format). The microphone array in FIG. 2 may include, for example, ten acoustic transducers: 2820(A) and 2820(B), which may be designed to be placed inside a corresponding ear of the user, acoustic transducers 2820(C), 2820(D), 2820(E), 2820(F), 2820(G), and 2820(H), which may be positioned at various locations on frame 2810, and/or acoustic transducers 2820(I) and 2820(J), which may be positioned on a corresponding neckband 2805.

In some embodiments, one or more of acoustic transducers 2820(A)-(F) may be used as output transducers (e.g., speakers). For example, acoustic transducers 2820(A) and/or 2820(B) may be earbuds or any other suitable type of headphone or speaker.

The configuration of acoustic transducers 2820 of the microphone array may vary. While augmented-reality system 2800 is shown in FIG. 28 as having ten acoustic transducers 2820, the number of acoustic transducers 2820 may be greater or less than ten. In some embodiments, using higher numbers of acoustic transducers 2820 may increase the amount of audio information collected and/or the sensitivity and accuracy of the audio information. In contrast, using a lower number of acoustic transducers 2820 may decrease the computing power required by the controller 2850 to process the collected audio information. In addition, the position of each acoustic transducer 2820 of the microphone array may vary. For example, the position of an acoustic transducer 2820 may include a defined position on the user, a defined coordinate on frame 2810, an orientation associated with each acoustic transducer, or some combination thereof.

Acoustic transducers 2820(A) and 2820(B) may be positioned on different parts of the user's ear, such as behind the pinna or within the auricle or fossa. Or, there may be additional acoustic transducers on or surrounding the ear in addition to acoustic transducers 2820 inside the ear canal. Having an acoustic transducer positioned next to an ear canal of a user may enable the microphone array to collect information on how sounds arrive at the ear canal. By positioning at least two of acoustic transducers 2820 on either side of a user's head (e.g., as binaural microphones), augmented-reality device 2800 may simulate binaural hearing and capture a 3D stereo sound field around about a user's head. In some embodiments, acoustic transducers 2820(A) and 2820(B) may be connected to augmented-reality system 2800 via a wired connection 2830, and in other embodiments, acoustic transducers 2820(A) and 2820(B) may be connected to augmented-reality system 2800 via a wireless connection (e.g., a Bluetooth connection). In still other embodiments, acoustic transducers 2820(A) and 2820(B) may not be used at all in conjunction with augmented-reality system 2800.

Acoustic transducers 2820 on frame 2810 may be positioned along the length of the temples, across the bridge, above or below display devices 2815(A) and 2815(B), or some combination thereof. Acoustic transducers 2820 may be oriented such that the microphone array is able to detect sounds in a wide range of directions surrounding the user wearing the augmented-reality system 2800. In some embodiments, an optimization process may be performed during manufacturing of augmented-reality system 2800 to determine relative positioning of each acoustic transducer 2820 in the microphone array.

In some examples, augmented-reality system 2800 may include or be connected to an external device (e.g., a paired device), such as neckband 2805. Neckband 2805 generally represents any type or form of paired device. Thus, the following discussion of neckband 2805 may also apply to various other paired devices, such as charging cases, smart watches, smart phones, wrist bands, other wearable devices, hand-held controllers, tablet computers, laptop computers and other external compute devices, etc.

As shown, neckband 2805 may be coupled to eyewear device 2802 via one or more connectors. The connectors may be wired or wireless and may include electrical and/or non-electrical (e.g., structural) components. In some cases, eyewear device 2802 and neckband 2805 may operate independently without any wired or wireless connection between them. While FIG. 28 illustrates the components of eyewear device 2802 and neckband 2805 in example locations on eyewear device 2802 and neckband 2805, the components may be located elsewhere and/or distributed differently on eyewear device 2802 and/or neckband 2805. In some embodiments, the components of eyewear device 2802 and neckband 2805 may be located on one or more additional peripheral devices paired with eyewear device 2802, neckband 2805, or some combination thereof. Furthermore, Pairing external devices, such as neckband 2805, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2800 may be provided by a paired device or shared between a paired device and an eyewear device, thus reducing the weight, heat profile, and form factor of the eyewear device overall while still retaining desired functionality. For example, neckband 2805 may allow components that would otherwise be included on an eyewear device to be included in neckband 2805 since users may tolerate a heavier weight load on their shoulders than they would tolerate on their heads. Neckband 2805 may also have a larger surface area over which to diffuse and disperse heat to the ambient environment. Thus, neckband 2805 may allow for greater battery and computation capacity than might otherwise have been possible on a stand-alone eyewear device. Since weight carried in neckband 2805 may be less invasive to a user than weight carried in eyewear device 2802, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 2805 may be communicatively coupled with eyewear device 2802 and/or to other devices. These other devices may provide certain functions (e.g., tracking, localizing, depth mapping, processing, storage, etc.) to augmented-reality system 2800. In the embodiment of FIG. 28, neckband 2805 may include two acoustic transducers (e.g., 2820(I) and 2820(J)) that are part of the microphone array (or potentially form their own microphone subarray). Neckband 2805 may also include a controller 2825 and a power source 2835.

Acoustic transducers 2820(I) and 2820(J) of neckband 2805 may be configured to detect sound and convert the detected sound into an electronic format (analog or digital). In the embodiment of FIG. 28, acoustic transducers 2820(I) and 2820(J) may be positioned on neckband 2805, thereby increasing the distance between the neckband acoustic transducers 2820(I) and 2820(J) and other acoustic transducers 2820 positioned on eyewear device 2802. In some cases, increasing the distance between acoustic transducers 2820 of the microphone array may improve the accuracy of beamforming performed via the microphone array. For example, if a sound is detected by acoustic transducers 2820(C) and 2820(D) and the distance between acoustic transducers 2820(C) and 2820(D) is greater than, e.g., the distance between acoustic transducers 2820(D) and 2820(E), the determined source location of the detected sound may be more accurate than if the sound had been detected by acoustic transducers 2820(D) and 2820(E).

Controller 2825 of neckband 2805 may process information generated by the sensors on 2805 and/or augmented-reality system 2800. For example, controller 2825 may process information from the microphone array that describes sounds detected by the microphone array. For each detected sound, controller 2825 may perform a direction-of-arrival (DOA) estimation to estimate a direction from which the detected sound arrived at the microphone array. As the microphone array detects sounds, controller 2825 may populate an audio data set with the information. In embodiments in which augmented-reality system 2800 includes an inertial measurement unit, controller 2825 may compute all inertial and spatial calculations from the IMU located on eyewear device 2802. A connector may convey information between augmented-reality system 2800 and neckband 2805 and between augmented-reality system 2800 and controller 2825. The information may be in the form of optical data, electrical data, wireless data, or any other transmittable data form. Moving the processing of information generated by augmented-reality system 2800 to neckband 2805 may reduce weight and heat in eyewear device 2802, making it more comfortable to the user.

Power source 2835 in neckband 2805 may provide power to eyewear device 2802 and/or to neckband 2805. Power source 2835 may include, without limitation, lithium ion batteries, lithium-polymer batteries, primary lithium batteries, alkaline batteries, or any other form of power storage. In some cases, power source 2835 may be a wired power source. Including power source 2835 on neckband 2805 instead of on eyewear device 2802 may help better distribute the weight and heat generated by power source 2835.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2900 in FIG. 29, that mostly or completely covers a user's field of view. Virtual-reality system 2900 may include a front rigid body 2902 and a band 2904 shaped to fit around a user's head. Virtual-reality system 2900 may also include output audio transducers 2906(A) and 2906(B). Furthermore, while not shown in FIG. 29, front rigid body 2902 may include one or more electronic elements, including one or more electronic displays, one or more inertial measurement units (IMUs), one or more tracking emitters or detectors, and/or any other suitable device or system for creating an artificial reality experience.

Artificial reality systems may include a variety of types of visual feedback mechanisms. For example, display devices in augmented-reality system 2900 and/or virtual-reality system 2900 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 2800 and/or virtual-reality system 2900 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 2700, augmented-reality system 2800, and/or virtual-reality system 2900 may include one or more optical sensors, such as two-dimensional (2D) or three-dimensional (3D) cameras, time-of-flight depth sensors, single-beam or sweeping laser rangefinders, 3D LiDartificial-reality sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 27 and 29, output audio transducers 2708(A), 2708(B), 2906(A), and 2906(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 2710 may include condenser microphones, dynamic microphones, ribbon microphones, and/or any other type or form of input transducer. In some embodiments, a single transducer may be used for both audio input and audio output.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A transparent circuit board comprising:
a transparent substrate;
a first conductive trace coupled to the transparent substrate;
an electrical component having a bottom surface facing the transparent substrate and a top surface facing away from the transparent substrate, wherein:
the bottom surface comprises a first electrical contact coupled to the first conductive trace; and
the top surface comprises a second electrical contact;
a second conductive trace electrically connected to the second electrical contact; and
a transparent encapsulation layer coupled to the transparent substrate and encapsulating the electrical component.

2. The transparent circuit board of claim 1, wherein:
the first conductive trace is coupled to a top surface of the transparent substrate;
a bottom surface of the transparent encapsulation layer is coupled to the top surface of the transparent substrate;
the second conductive trace is coupled to a top surface of the transparent encapsulation layer and runs parallel to the first conductive trace; and
the transparent circuit board further comprises an additional transparent encapsulation layer coupled to the top surface of the transparent encapsulation layer and encapsulating the second conductive trace.

3. The transparent circuit board of claim 2, wherein the first conductive trace and the second conductive trace are positioned to overlap relative to a field-of-view of a user when the user is looking through the transparent circuit board.

4. The transparent circuit board of claim 1, wherein:
the transparent substrate comprises an ophthalmic lens; and
the electrical component comprises a light emitting component of an eye-tracking system.

5. The transparent circuit board of claim 4, wherein the light emitting component comprises a vertical-cavity surface-emitting laser.

6. The transparent circuit board of claim 1, further comprising a plurality of additional electrical components coupled to the transparent substrate and encapsulated by the transparent encapsulation layer.

7. The transparent circuit board of claim 1, wherein:
the electrical component further comprises a side, the side comprising a passivation material;
the first conductive trace is coupled to a top surface of the transparent substrate;
the second conductive trace is coupled to the top surface of the transparent substrate;
the transparent circuit board further comprises a conductive material coupled to the side of the electrical component and electrically coupling the second electrical contact to the second conductive trace; and
a bottom surface of the transparent encapsulation layer is coupled to the top surface of the transparent substrate.

8. The transparent circuit board of claim 1, wherein:
the first conductive trace is coupled to a top surface of the transparent substrate;
the electrical component further comprises:
a channel passing through the electrical component from the top surface of the electrical component to the bottom surface of the electrical component; and
an internal passivation layer lining the channel; and
the second conductive trace is coupled to the top surface of the transparent substrate and electrically connected to the second electrical contact through the channel.

9. The transparent circuit board of claim 1, wherein the first conductive trace and the second conductive trace are operable to provide power to the electrical component.

10. An ophthalmic device comprising:
a see-through element positioned to be in a field-of-view of a user of the ophthalmic device;
a first conductive trace coupled to the see-through element;
an electrical component having a bottom surface facing the see-through element and a top surface facing away from the see-through element, wherein:
the bottom surface comprises a first electrical contact coupled to the first conductive trace; and
the top surface comprises a second electrical contact;
a second conductive trace electrically connected to the second electrical contact; and
a transparent encapsulation layer coupled to the see-through element and encapsulating the electrical component.

11. The ophthalmic device of claim 10, wherein the electrical component is one light source in an array of light sources operable to direct, as part of an eye-tracking system, light at an eye of the user, wherein the eye-tracking system uses specular or diffuse reflections of the light from the eye for pupil tracking.

12. The ophthalmic device of claim 11, wherein the array of light sources comprises an array of vertical-cavity surface-emitting lasers.

13. The ophthalmic device of claim 10, wherein the see-through element comprises a see-through near-field display of an artificial-reality system.

14. The ophthalmic device of claim 10, wherein the see-through element comprises a corrective ophthalmic lens.

15. The ophthalmic device of claim 10, wherein:
the first conductive trace is coupled to a top surface of the see-through element;
a bottom surface of the transparent encapsulation layer is coupled to the top surface of the see-through element;
the second conductive trace is coupled to a top surface of the transparent encapsulation layer and runs parallel to the first conductive trace;
the ophthalmic device further comprises an additional transparent encapsulation layer coupled to the top surface of the transparent encapsulation layer and encapsulating the second conductive trace; and
the first conductive trace and the second conductive trace are positioned to overlap relative to the field-of-view of the user when the user is looking through the see-through element.

16. The ophthalmic device of claim 10, wherein:
the electrical component further comprises a side, the side comprising a passivation material;
the first conductive trace is coupled to a top surface of the see-through element;
the second conductive trace is coupled to the top surface of the see-through element;
the ophthalmic device further comprises a conductive material coupled to the side of the electrical component and electrically coupling the second electrical contact to the second conductive trace; and
a bottom surface of the transparent encapsulation layer is coupled to the top surface of the see-through element.

17. The ophthalmic device of claim 10, wherein:
the first conductive trace is coupled to a top surface of the see-through element;
the electrical component further comprises:
a channel passing through the electrical component from the top surface of the electrical component to the bottom surface of the electrical component; and
an internal passivation layer lining the channel; and
the second conductive trace is coupled to the top surface of the see-through element and electrically connected to the second electrical contact through the channel.

18. The ophthalmic device of claim 10, further comprising:
a support housing supporting the see-through element; and
an additional electrical component within the support housing, wherein the first conductive trace and the second conductive trace extend from the electrical component to the additional electrical component.

19. The ophthalmic device of claim 18, wherein:
the additional electrical component comprises a power source; and
the first conductive trace and the second conductive trace are operable to provide power to the electrical component.

20. A method comprising:
applying a first conductive trace to a top surface of a transparent substrate;
bonding an electrical component to the first conductive trace, the electrical component having a bottom surface facing the transparent substrate and a top surface facing away from the transparent substrate, wherein:
the bottom surface comprises a first electrical contact bonded to the first conductive trace; and
the top surface comprises a second electrical contact;
applying a first transparent encapsulation layer to the top surface of the transparent substrate;
applying a second conductive trace to the second electrical contact and a top surface of the first transparent encapsulation layer; and
applying a second transparent encapsulation layer to a top surface of the first transparent encapsulation layer.

* * * * *